US012604628B2

(12) United States Patent
Chen et al.

(10) Patent No.: US 12,604,628 B2
(45) Date of Patent: Apr. 14, 2026

(54) DISPLAY SUBSTRATE AND MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yipeng Chen, Beijing (CN); Ling Shi, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 401 days.

(21) Appl. No.: 18/253,951

(22) PCT Filed: Apr. 29, 2022

(86) PCT No.: PCT/CN2022/090494
§ 371 (c)(1),
(2) Date: May 23, 2023

(87) PCT Pub. No.: WO2023/206436
PCT Pub. Date: Nov. 2, 2023

(65) Prior Publication Data
US 2024/0373708 A1      Nov. 7, 2024

(51) Int. Cl.
*H10K 59/131*      (2023.01)
*H10K 59/12*      (2023.01)
*H10K 77/10*      (2023.01)

(52) U.S. Cl.
CPC ..... *H10K 59/1315* (2023.02); *H10K 59/1201* (2023.02); *H10K 77/111* (2023.02)

(58) Field of Classification Search
CPC ........... H10K 59/1315; H10K 59/1201; H10K 77/111; H10K 59/00; H10K 59/124; H10K 59/131
See application file for complete search history.

(56) References Cited

U.S. PATENT DOCUMENTS

2017/0338249 A1*  11/2017  Suzumura .......... H10D 30/6731
2018/0308869 A1    10/2018  Suzumura et al.
(Continued)

FOREIGN PATENT DOCUMENTS

CN      104600029 A      5/2015
CN      107403806 A      11/2017
(Continued)

*Primary Examiner* — J. E. Schoenholtz
(74) *Attorney, Agent, or Firm* — XSENSUS LLP

(57)      ABSTRACT

A display substrate includes a substrate, and first active layers, a first functional layer, a second active layer, a second functional layer and an interlayer dielectric layer stacked in sequence on the substrate. The display substrate further includes first vias, second vias and third vias. The first vias each penetrate at least a portion of the second functional layer and at least a portion of the first functional layer, and each expose a partial surface of a first active layer. The second vias each penetrate the interlayer dielectric layer, and are respectively communicated with the first vias. The third vias each penetrate the interlayer dielectric layer and at least another portion of the second functional layer, and each expose a partial surface of the second active layer. The first vias are formed before the interlayer dielectric layer, and the third vias are formed later than the interlayer dielectric layer.

19 Claims, 17 Drawing Sheets

(56) References Cited

U.S. PATENT DOCUMENTS

| | | | |
|---|---|---|---|
| 2019/0198534 A1 | 6/2019 | Je et al. | |
| 2022/0069021 A1 | 3/2022 | Kim et al. | |
| 2022/0149145 A1* | 5/2022 | Noh | H10D 86/481 |
| 2023/0139734 A1 | 5/2023 | Cao et al. | |
| 2024/0057419 A1* | 2/2024 | Noh | H10K 59/1213 |
| 2024/0312998 A1* | 9/2024 | Seo | H10K 59/1213 |

FOREIGN PATENT DOCUMENTS

| | | | |
|---|---|---|---|
| CN | 113241368 | B | 11/2021 |
| CN | 215896392 | U | 2/2022 |
| WO | 2022104739 | A1 | 5/2022 |

* cited by examiner

| Provide a substrate | ⟩ S100 |
|---|---|

↓

| Form first active layers, a first functional layer, second active layer(s) and a second functional layer in sequence on the substrate | ⟩ S200 |
|---|---|

↓

| Form first vias each penetrating at least a portion of the second functional layer and at least a portion of the first functional layer, the first vias each exposing a partial surface of a first active layer | ⟩ S300 |
|---|---|

↓

| Form an interlayer dielectric layer on the second functional layer, a portion of the interlayer dielectric layer being filled in the first vias | ⟩ S400 |
|---|---|

↓

| Remove the portion of the interlayer dielectric layer that is filled in the first vias, and form second vias that are respectively communicated with the first vias in the interlayer dielectric layer | ⟩ S500 |
|---|---|

↓

| Form third vias each penetrating the interlayer dielectric layer and at least a portion of the second functional layer, the third vias each exposing a partial surface of a second active layer | ⟩ S600 |
|---|---|

FIG. 3

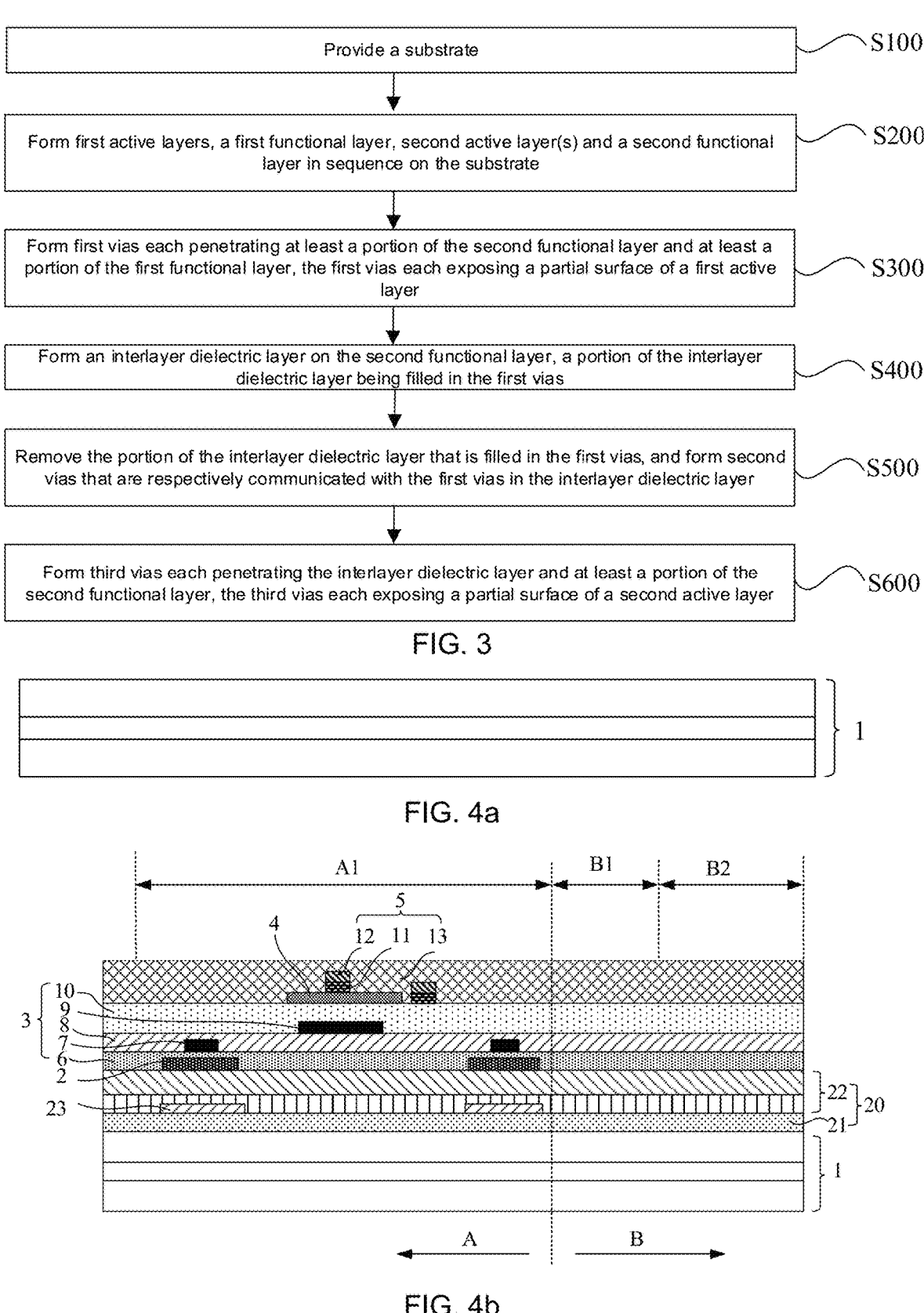

A area  B area

▨ A area   ⬚ B area   ▨ C area   ▦ D area

A area    B area    C area    D area    E area

1

DISPLAY SUBSTRATE AND MANUFACTURING METHOD THEREOF, AND DISPLAY DEVICE

CROSS-REFERENCE TO RELATED APPLICATION

This application is a national phase entry under 35 USC 371 of International Patent Application No. PCT/CN 2022/090494 filed on Apr. 29, 2022, which is incorporated herein by reference in its entirety.

TECHNICAL FIELD

The present disclosure relates to the field of display technologies, and in particular, to a display substrate and a manufacturing method thereof, and a display device.

BACKGROUND

An organic light-emitting diode (OLED) display device is a display device manufactured by using organic light-emitting diodes. At present, OLED display devices are widely used due to their excellent characteristics of no backlight, high contrast, thin thickness, wide viewing angle, fast response speed, applicability to flexible panels, wide operating temperature range, and simple structure and process.

SUMMARY

In an aspect, a display substrate is provided. The display substrate includes a substrate, and first active layers, a first functional layer, a second active layer, a second functional layer and an interlayer dielectric layer stacked in sequence on the substrate. The display substrate further includes first vias, second vias and third vias. The first vias each penetrate at least a portion of the second functional layer and at least a portion of the first functional layer, and the first vias each expose a partial surface of a first active layer. The second vias each penetrate the interlayer dielectric layer, and the second vias are respectively communicated with the first vias. The third vias each penetrate the interlayer dielectric layer and at least another portion of the second functional layer, and the third vias each expose a partial surface of the second active layer. An aperture diameter of a first via is less than an aperture diameter of a second via, and is less than an aperture diameter of a third via.

In some embodiments, the display substrate has a display area and a non-display area. The display area includes pixel circuit areas. The display substrate further includes fifth grooves and a first groove. The fifth grooves each penetrate at least yet another portion of the second functional layer and at least another portion of the first functional layer, and the fifth grooves each are located between two adjacent pixel circuit areas. The first groove penetrates at least yet another portion of the second functional layer and at least yet another portion of the first functional layer. A depth of a second via in the second vias is less than or equal to a depth of a third via in the third vias. The depth of the third via is less than a depth of a first via in the first vias. The depth of the first via is less than a depth of a fifth groove. The depth of the fifth groove is equal to a depth of the first groove.

In another aspect, a manufacturing method of a display substrate is provided. The manufacturing method of the display substrate includes: providing a substrate; forming first active layers, a first functional layer, a second active layer and a second functional layer in sequence on the substrate; forming first vias each penetrating at least a portion of the second functional layer and at least a portion of the first functional layer, the first vias each exposing a partial surface of a first active layer; forming an interlayer dielectric layer on the second functional layer, a portion of the interlayer dielectric layer being filled in the first vias; removing the portion of the interlayer dielectric layer that is filled in the first vias; forming second vias that are respectively communicated with the first vias in the interlayer dielectric layer; and forming third vias each penetrating the interlayer dielectric layer and at least another portion of the second functional layer, the third vias each exposing a partial surface of the second active layer.

In some embodiments, in a process of removing the portion of the interlayer dielectric layer that is filled in the first vias and forming the second vias that are respectively communicated with the first vias in the interlayer dielectric layer, the manufacturing method further includes: forming fourth vias each penetrating the interlayer dielectric layer. An orthographic projection of a fourth via on the substrate is located within an orthographic projection of the second active layer on the substrate. Forming the third vias each penetrating the interlayer dielectric layer and the at least another portion of the second functional layer, includes: patterning the second functional layer through the fourth vias to form fifth vias each penetrating the at least another portion of the second functional layer. A third via includes a fourth via and a fifth via.

In some embodiments, the substrate has a display area and a non-display area, and the non-display area includes a bending area. The first active layers and the second active layer are located in the display area. Before forming the first active layers, the first functional layer, the second active layer and the second functional layer in sequence on the substrate, the manufacturing method further includes: forming an inorganic layer on the substrate. In a process of forming the first vias each penetrating the at least a portion of the second functional layer and the at least a portion of the first functional layer, the manufacturing method further includes: forming a first groove penetrating at least yet another portion of the second functional layer and at least another portion of the first functional layer. The first groove is located in the bending area, and exposes a partial surface of the inorganic layer.

In some embodiments, the manufacturing method further includes: forming a first conductive film on the interlayer dielectric layer, the first conductive film covering a surface of the interlayer dielectric layer and being located in the first vias, the second vias, the third vias and the first groove; and patterning the first conductive film, so that a portion of the first conductive film located in the first vias and the second vias is retained to obtain first conductive patterns, and a portion of the first conductive film located in the third vias is retained to obtain second conductive patterns.

In some embodiments, a contact resistance between a first conductive pattern and a first active layer whose partial surface is exposed through a first via where the first conductive pattern is located is in a range of $969\Omega$ to $1747\Omega$, inclusive.

In some embodiments, the manufacturing method further includes: forming a passivation layer on the first conductive patterns and the second conductive patterns, a portion of the passivation layer being located in the first groove and being in contact with the exposed partial surface of the inorganic layer; and patterning the passivation layer to remove at least the portion of the passivation layer located in the first groove.

In some embodiments, the manufacturing method further includes: patterning the inorganic layer through the first groove to form a second groove that is communicated with the first groove, the second groove exposing a partial surface of the substrate; and forming a first planarization layer, a portion of the first planarization layer being filled in the first groove and the second groove, and being in contact with the exposed partial surface of the substrate.

In some embodiments, the non-display area further includes a cutting area located on a side of the bending area away from the display area. In a process of forming the first groove penetrating the at least yet another portion of the second functional layer and the at least another portion of the first functional layer, the manufacturing method further includes: forming a third groove penetrating at least yet another portion of the second functional layer and at least yet another portion of the first functional layer. The third groove is located in the cutting area, and exposes another partial surface of the inorganic layer.

In some embodiments, the manufacturing method further includes: patterning the inorganic layer through the third groove to form a fourth groove that is communicated with the third groove, the fourth groove exposing a partial surface of the substrate; and forming a first planarization layer, a portion of the first planarization layer being filled in the third groove and the fourth groove, and being in contact with the exposed partial surface of the substrate.

In some embodiments, forming the first functional layer includes: forming a first gate insulating layer, first gates, a second gate insulating layer, a second gate and a third gate insulating layer in sequence. An orthographic projection of a first gate on the substrate is partially overlapped with an orthographic projection of a first active layer in the first active layers on the substrate, and an orthographic projection of the second gate on the substrate is partially overlapped with an orthographic projection of the second active layer on the substrate. Forming the second functional layer includes: forming a fourth gate insulating layer, a third gate and a fifth gate insulating layer in sequence. An orthographic projection of the third gate on the substrate is partially overlapped with the orthographic projection of the second active layer on the substrate.

In some embodiments, the substrate has a display area including a plurality of pixel circuit areas. In a process of forming the first vias each penetrating the at least a portion of the second functional layer and the at least a portion of the first functional layer, the manufacturing method further includes: forming fifth grooves each penetrating at least yet another portion of the second functional layer and at least another portion of the first functional layer, the fifth grooves each being located between two adjacent pixel circuit areas. In a process of forming the interlayer dielectric layer on the second functional layer, another portion of the interlayer dielectric layer is filled in the fifth grooves.

In some embodiments, forming the fifth grooves each penetrating the at least yet another portion of the second functional layer and the at least another portion of the first functional layer, includes: before forming the first vias each penetrating the at least a portion of the second functional layer and the at least a portion of the first functional layer, forming sixth grooves each penetrating at least yet another portion of the second functional layer and the third gate insulating layer, the sixth grooves each being located between two adjacent pixel circuit areas. In the process of forming the first vias each penetrating the at least a portion of the second functional layer and the at least a portion of the first functional layer, forming seventh grooves that penetrate the second gate insulating layer and the first gate insulating layer and are respectively communicated with the sixth grooves through the sixth grooves. A fifth groove includes a sixth groove and a seventh groove.

In some embodiments, an orthographic projection of the fourth gate insulating layer on the substrate coincides with the orthographic projection of the third gate on the substrate.

In some embodiments, a material of the first active layers includes polysilicon, and a material of the second active layer includes a metal oxide.

In yet another aspect, a display device is provided. The display device includes the display substrate in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, and an actual process of a method involved in the embodiments of the present disclosure.

FIG. 3 is a flow diagram of a manufacturing method of a display substrate, in accordance with some embodiments of the present disclosure;

DETAILED DESCRIPTION

Figure 1:
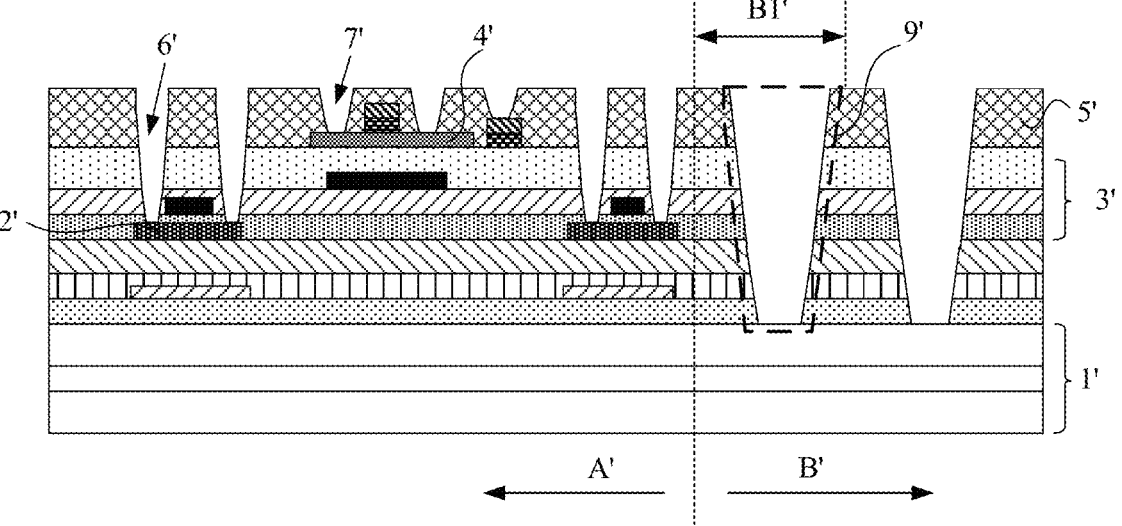
FIG. 1 is a sectional view of a display substrate to be formed in an implementation.

Technical solutions in some embodiments of the present disclosure will be described clearly and completely below with reference to the accompanying drawings.

Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and extensions thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phrase "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

It will be understood that when a layer or element is described as being on another layer or substrate, the layer or element may be directly on the another layer or substrate, or intermediate layer(s) may exist between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Figure 2:
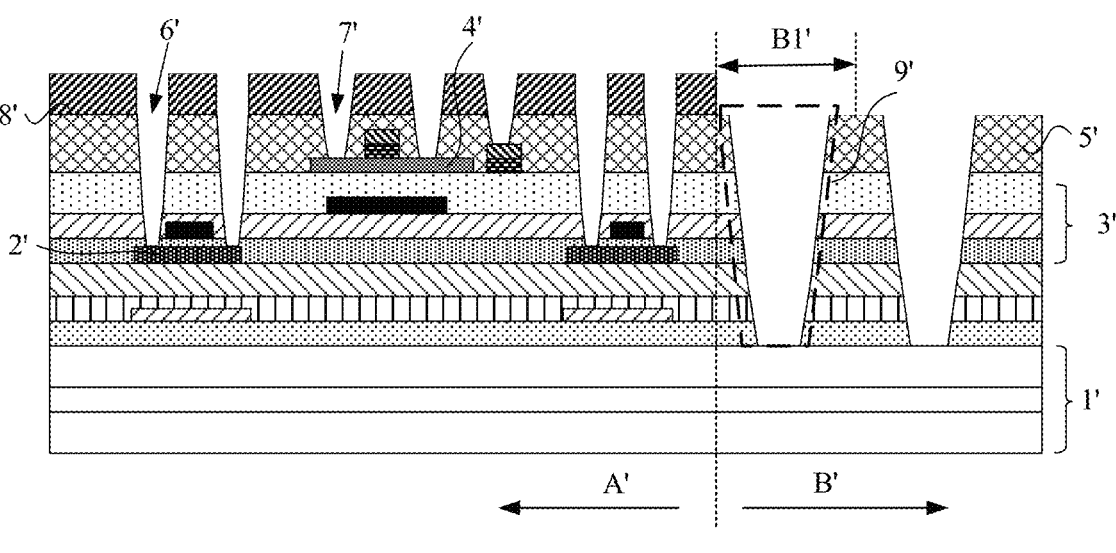
FIG. 2 is a sectional view of another display substrate to be formed in an implementation.

In an implementation, in a manufacturing process of a display substrate, referring to FIG. 1, firstly, first active layers 2', a first functional layer 3', a second active layer 4' and a second functional layer 5' are usually formed in sequence on a substrate 1'. A material of the second active layer 4' includes metal oxide. Then, first connection holes 6' each exposing a first active layer 2' and second connection holes 7' exposing the second active layer 4' are synchronously formed at corresponding positions of the second functional layer 5'. Referring to FIG. 2, an interlayer dielectric layer 8' is then formed on the second functional layer 5'. The interlayer dielectric layer 8' is located in a region beyond the first connection holes 6' and the second connection holes 7'. In a process of forming the interlayer dielectric layer 8', a material of the interlayer dielectric layer 8' is located in the first connection holes 6' and the second connection holes 7', so that the material of the interlayer dielectric layer 8' located in the first connection holes 6' and the second connection holes 7' needs to be removed to obtain the interlayer dielectric layer 8'. This easily causes the material of the interlayer dielectric layer 8' to remain on the first active layers 2' at the first connection holes 6', and a cleaning agent capable of removing the material of the interlayer dielectric layer 8' may corrode the exposed second active layer 4', which results in inefficient removal of the material of the interlayer dielectric layer 8' remaining on the first active layers 2'. Therefore, after a source and a drain are respectively formed in the first connection holes 6' to form a transistor, the residual material of the interlayer dielectric layer 8' results in an increased contact resistance between the source and the first active layer 2' and an increased contact resistance between the drain and the first active layer 2', thereby affecting electrical characteristics of the formed transistor and a display effect of the display substrate.

Based on this, some embodiments of the present disclosure provide a manufacturing method of a display substrate. Referring to FIG. 3, the manufacturing method includes S100 to S300.

In S100, as shown in FIG. 4a, a substrate 1 is provided.

For example, a structure and a material of the substrate 1 vary, and may be set according to actual needs.

For example, the substrate 1 may be of a single-layer structure.

For example, the substrate 1 may be a rigid substrate. The rigid substrate may be, for example, a glass substrate or a polymethyl methacrylate (PMMA) substrate. In this case, the display substrate 100 may be a rigid display substrate.

For another example, the substrate 1 may be a flexible substrate. The flexible substrate may be, for example, a polyethylene terephthalate (PET) substrate, a polyethylene naphthalate two formic acid glycol ester (PEN) substrate or a polyimide (PI) substrate. In this case, the display substrate 100 may be a flexible display substrate.

For example, the substrate 1 may be of a multi-layer structure. That is, the substrate 1 includes a plurality of sub-film layers, and a material of each sub-film layer may be the same or different.

For example, referring to FIG. 4*a*, the substrate 1 includes three sub-film layers stacked in sequence, and materials of the three sub-film layers of the substrate 1 may include polyimide (PI), silicon oxide (SiO), polyimide (PI), respectively.

The drawings of the present disclosure illustrate the substrate 1 of a three-layer structure. That is, the substrate 1 includes the three sub-film layers stacked in sequence.

In S200, referring to FIG. 4*b*, first active layers 2, a first functional layer 3, second active layer(s) 4 and a second functional layer 5 are formed in sequence on the substrate 1.

For example, a step of forming the first active layers 2 on the substrate 1 in S200 may include: forming a first active film on the substrate 1, and patterning the first active film by a patterning process, so as to form the first active layers 2.

For example, the patterning process may include plasma etching and photolithography processes.

For example, there are a plurality of formed first active layers 2. The specific number of the first active layers 2 may be determined according to the number of transistors to be formed, which is not limited in the present disclosure.

In some examples, a material of the first active layer 2 includes polysilicon.

It will be understood that a transistor including polysilicon has a characteristic of high mobility, which is conducive to improving a mobility of a transistor manufactured in the present disclosure.

For example, the first functional layer 3 includes a plurality of sub-film layers with different functions, which is not limited in the present disclosure.

For example, the first functional layer 3 includes a first gate insulating layer 6, first gates 7, a second gate insulating layer 8, second gate(s) 9 and a third gate insulating layer 10 that are stacked in sequence in a direction away from the substrate 1.

In some examples, referring to FIG. 4*b*, a method of forming the first functional layer 3 in S200 includes S210.

In S210, the first gate insulating layer 6, the first gates 7, the second gate insulating layer 8, the second gate(s) 9 and the third gate insulating layer 10 are formed in sequence. An orthographic projection of a first gate 7 on the substrate 1 is partially overlapped with an orthographic projection of a first active layer 2 on the substrate 1. An orthographic projection of a second gate 9 on the substrate 1 is partially overlapped with an orthographic projection of a second active layer 4 on the substrate 1.

For example, the first gate insulating layer 6 is made of an inorganic material. For example, the material of the first gate insulating layer 6 includes at least one of silicon oxide (SiO), silicon nitride (SiN), and silicon oxynitride (SiON). The first gate insulating layer 6 may provide insulation protection between the first active layer 2 and the first gate 7.

For example, a method of forming the first gate insulating layer 6 includes a deposition process.

The first gate insulating layer 6 with a certain thickness may be deposited on a side of the first active layers 2 away from the substrate 1 by using a physical vapor deposition (PVD) method or a plasma enhanced chemical vapor deposition (PECVD) method.

For example, the first gate 7 is made of a conductive material. For example, the material of the first gate 7 includes molybdenum (Mo), aluminum (Al), or copper (Cu), or an alloy thereof. A method of forming the first gates 7 includes: forming a first gate conductive film on a side of the first gate insulating layer 6 away from the substrate 1, and then patterning the first gate conductive film by using a photoetching process, so as to obtain the first gates 7.

For example, a method of patterning the first gate conductive film by using the photolithography process includes as follows. A photoresist is coated on the first gate conductive film. Then, a mask is provided on a side of the photoresist away from the substrate 1, and the photoresist is exposed and developed through the mask, so as to remove an exposed portion of the photoresist and reserve an unexposed portion of the photoresist, thereby forming the patterned photoresist. Next, the first gate conductive film is etched by using the patterned photoresist as a mask to remove a portion of the first gate conductive film that is not shielded by the patterned photoresist, so as to form the first gates 7. Finally, the display substrate to be formed may be placed in a stripping solution to dissolve and strip the patterned photoresist.

For example, the second gate insulating layer 8 is made of an inorganic material. For example, the material of the second gate insulating layer 8 includes at least one of silicon nitride (SiN), silicon oxide (SiO), and silicon oxynitride (SiON). The second gate insulating layer 8 may provide insulation protection between the first gate 7 and the second gate 9.

For example, a method of forming the second gate insulating layer 8 includes a deposition process.

The method of forming the second gate insulating layer 8 may refer to the method of forming the first gate insulating layer 6, and will not be repeated here.

For example, the second gate 9 is made of a conductive material. For example, the material of the second gate 9 includes molybdenum (Mo), aluminum (Al), or copper (Cu), or an alloy thereof. A method of forming the second gate(s) 9 may include: forming a second gate conductive film on a side of the second gate insulating layer 8 away from the substrate 1, and then patterning the second gate conductive film by using a photoetching process, so as to obtain the second gate(s) 9.

For example, a material of the third gate insulating layer 10 includes an inorganic material. For example, the material of the third gate insulating layer 10 includes at least one of silicon oxide (SiO), silicon nitride (SiN), and silicon oxynitride (SiON). The third gate insulating layer 10 may provide insulation protection between the second gate 9 and the second active layer 4.

For example, a method of forming the third gate insulating layer 10 includes a deposition process.

The method of forming the third gate insulating layer 10 may refer to the method of forming the first gate insulating layer 6, and will not be repeated here.

For example, the orthographic projection of the first gate 7 on the substrate 1 is arranged to be partially overlapped with the orthographic projection of the first active layer 2 on the substrate 1, which is conducive to realizing a control of the first gate 7 on a transistor including the first active layer 2.

It will be understood that a plurality of first electrode plates may be synchronously obtained after the first gate conductive film is patterned. A plurality of second electrode plates may be synchronously obtained after the second gate conductive film is patterned. For example, a first electrode plate is arranged opposite to a second electrode plate to constitute a storage capacitor Cst.

In addition, after any one of the first gate conductive film and the second gate conductive film is patterned, a plurality of signal lines may be further obtained synchronously. The plurality of signal lines include, for example, at least one of first gate lines GateP, second gate lines GateN, enable signal lines EM and reset signal lines ResetN, and initialization signal lines.

For example, in a case where the first gate lines GateP are obtained from the first gate conductive film, a first gate line GateP has a portion whose orthographic projection on the substrate 1 is overlapped with an orthographic projection of a first active layer 2 on the substrate 1, which constitutes, for example, a first gate 7. In a case where the enable signal lines EM are obtained from the first gate conductive film, an enable signal line EM has a portion whose orthographic projection on the substrate 1 is overlapped with an orthographic projection of a first active layer 2 on the substrate 1, which constitutes, for example, a first gate 7. In a case where the second gate lines GateN are obtained from the second gate conductive film, a second gate line GateN has a portion whose orthographic projection on the substrate 1 is overlapped with an orthographic projection of a second active layer 4 on the substrate 1, which constitutes, for example, a second gate 9. In a case where the reset signal lines ResetN are obtained from the second gate conductive film, a reset signal line ResetN has a portion whose orthographic projection on the substrate 1 is overlapped with an orthographic projection of a second active layer 4 on the substrate 1, which constitutes, for example, a second gate 9.

The first gate lines GateP, the second gate lines GateN, the enable signal lines EM, and the reset signal lines ResetN may refer to the following description, and will not be repeated here.

For example, a step of forming the second active layer(s) 4 in S200 may include: forming a second active film on the first functional layer 3, and patterning the second active film by a patterning process, so as to form the second active layer(s) 4.

For example, the patterning process may include plasma etching and photolithography processes.

For example, there may be a plurality of second active layers 4. The specific number of the second active layer(s) 4 may be determined according to the number of transistors to be formed, which is not limited in the present disclosure.

In some examples, a material of the second active layer 4 includes metal oxide. For example, the material of the second active layer 4 includes indium gallium zinc oxide (IGZO).

It will be understood that a transistor including metal oxide has a characteristic of low leakage current, which is conducive to reducing a leakage current of a transistor manufactured in the present disclosure.

For example, the second functional layer 5 includes a plurality of sub-film layers with different functions, and the number and material of the sub-film layers are not limited in the present disclosure.

For example, referring to FIG. 4b, the second functional layer 5 includes fourth gate insulating layer(s) 11, third gate(s) 12 and a fifth gate insulating layer 13 stacked in sequence.

In some examples, referring to FIG. 4b, a method of forming the second functional layer 5 in S200 includes S220.

In S220, the fourth gate insulating layer(s) 11, the third gate(s) 12 and the fifth gate insulating layer 13 are formed in sequence. An orthographic projection of a third gate 12 on the substrate 1 is partially overlapped with an orthographic projection of a second active layer 4 on the substrate 1.

For example, the fourth gate insulating layer 11 is made of an inorganic material. For example, the material of the fourth gate insulating layer 11 includes at least one of silicon oxide (SiO), silicon nitride (SiN), and silicon oxynitride (SiON). The fourth gate insulating layer 11 may provide insulation protection between the third gate 12 and the second active layer 4.

For example, a method of forming the fourth gate insulating layer(s) 11 includes a deposition process and a photolithography process.

For example, the third gate 12 is made of a metal conductive material. For example, the material of the third gate 12 includes molybdenum (Mo) and titanium nitride (TiN) stacked in sequence. A method of forming the third gate(s) 12 may include: forming a third gate conductive film on a side of the fourth gate insulating layer(s) 11, the second active layer(s) 4 and the third insulating layer 10 away from the substrate 1, and then patterning the third gate conductive film to obtain the third gate(s) 12.

For example, a method of patterning the third gate conductive film includes a photolithography process.

It will be understood that a plurality of signal lines may also be obtained after the third gate conductive film is patterned. The plurality of signal lines include, for example, at least one of second gate lines GateN and reset signal lines ResetN.

In a case where the second gate lines GateN are obtained from the third gate conductive film, a second gate line GateN has a portion whose orthographic projection on the substrate 1 is overlapped with an orthographic projection of a second active layer 4 on the substrate 1, which constitutes, for example, a third gate 12. In a case where the reset signal lines ResetN are obtained from the third gate conductive film, a reset signal line ResetN has a portion whose orthographic projection on the substrate 1 is overlapped with an orthographic projection of a second active layer 4 on the substrate 1, which constitutes, for example, a third gate 12.

For example, an orthographic projection of a second gate line GateN obtained from the second gate conductive film on the substrate 1 is partially overlapped with an orthographic projection of a second gate line GateN obtained from the third gate conductive film on the substrate 1, and an orthographic projection of a reset signal line ResetN obtained from the second gate conductive film on the substrate 1 is partially overlapped with an orthographic projection of a reset signal line ResetN obtained from the third gate conductive film on the substrate 1.

In addition, first initialization signal lines Vinit1 or second initialization signal lines Vinit2 may also be obtained after the third gate conductive film is patterned. The first initialization signal lines Vinit1 or the second initialization signal lines Vinit2 may refer to the following description, and will not be repeated here.

In some examples, the fourth gate insulating layer(s) 11 are arranged as a whole layer, and an orthographic projection of the fourth gate insulating layer(s) on the substrate 1 is different from an orthographic projection of a third gate 12 on the substrate 1. Therefore, after the fourth gate insulating layer(s) 11 and the third gate conductive film are formed, the third gate conductive film needs to be patterned to form the third gate(s) 12.

Figures 4C, 4D:
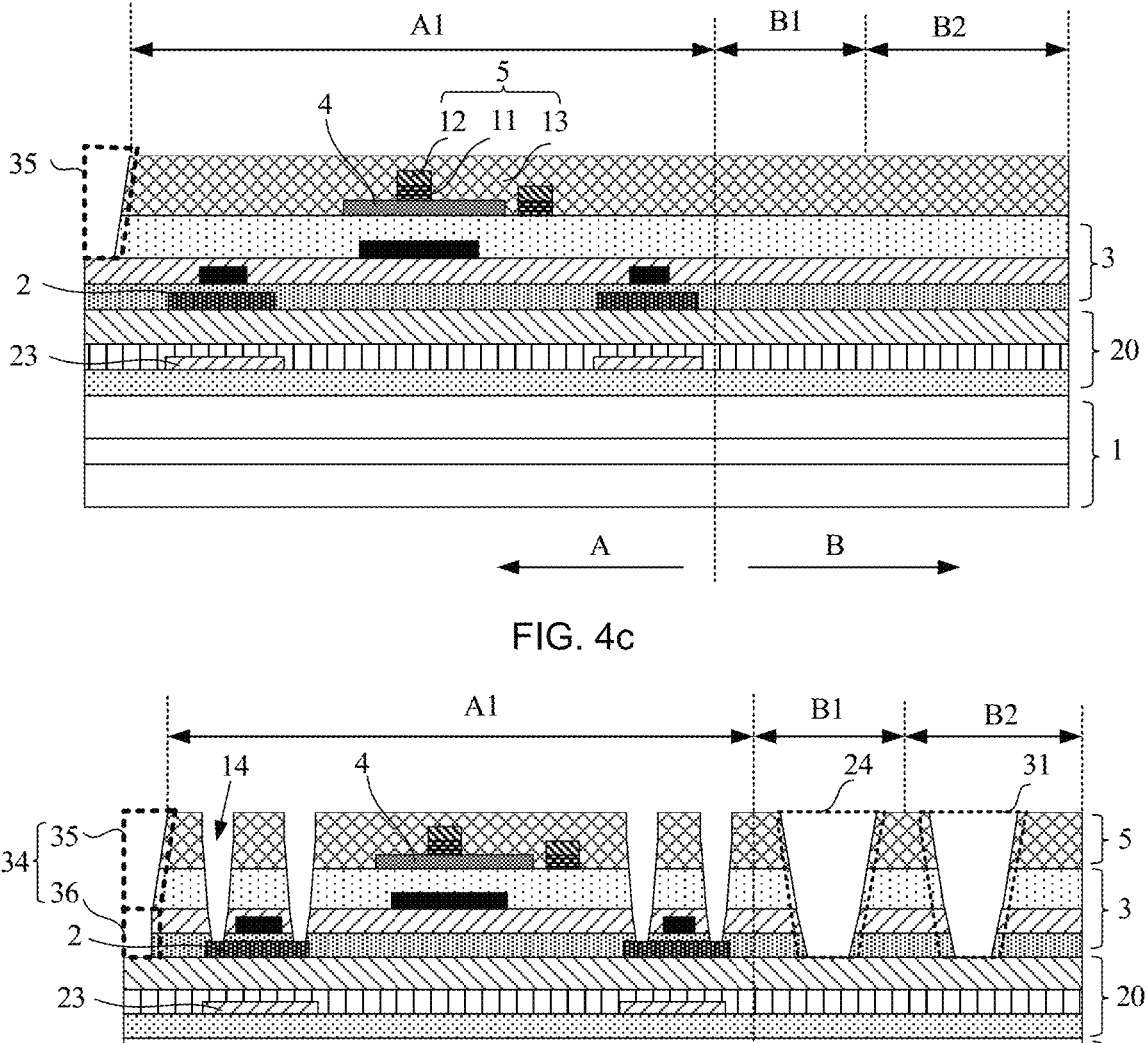
FIGS. 4a to 4o are diagrams showing steps of manufacturing a display substrate, in accordance with some embodiments of the present disclosure.

In some other examples, referring to FIG. 4c, the fourth gate insulating layer(s) 11 are not arranged as a whole layer, and an orthographic projection of a fourth gate insulating layer 11 on the substrate 1 coincides with an orthographic projection of a third gate 12 on the substrate 1.

For example, after a film including the fourth gate insulating layer(s) 11 and the third gate conductive film are formed, the film of the fourth gate insulating layer(s) 11 and the third gate conductive film may be patterned synchronously to obtain the fourth gate insulating layer(s) 11 and the third gate(s) 12, and the orthographic projection of the fourth gate insulating layer 11 on the substrate 1 coincides with the orthographic projection of the third gate 12 on the substrate 1. In this way, on a basis of ensuring the insulation protection function of the fourth gate insulation layer(s) 11, the number of films of the display substrate in a region beyond the third gate(s) 12 may be reduced, so that a thickness of the display substrate may be reduced to a certain extent.

For example, a material of the fifth gate insulating layer 13 includes an inorganic material. For example, the material of the fifth gate insulating layer 13 includes at least one of silicon oxide (SiO), silicon nitride (SiN), and silicon oxynitride (SiON). The fifth gate insulating layer 13 may provide insulation protection to the third gate(s) 12 and the second active layer(s) 4.

For example, a method of forming the fifth gate insulating layer 13 includes a deposition process.

The method of forming the fifth gate insulating layer 13 may refer to the method of forming the first gate insulating layer 6, and will not be repeated here.

For example, the orthographic projection of the second gate 9 on the substrate 1 is arranged to be partially overlapped with the orthographic projection of the second active layer 4 on the substrate 1, and the orthographic projection of the third gate 12 on the substrate 1 is arranged to be partially overlapped with the orthographic projection of the second active layer 4 on the substrate 1, so that a transistor with a top-bottom gate structure may be obtained. Moreover, this is conducive to realizing a control of the second gate 9 and the third gate 12 on a transistor including the second active layer 4.

For example, the orthographic projection of the first active layer 2 on the substrate 1 is non-overlapped with the orthographic projection of the second active layer 4 on the substrate 1. That is, in a direction perpendicular to the substrate 1, the first active layer 2 and the second active layer 4 have no overlapping portion. In this way, in a subsequent step of forming vias at the first active layer 2 and the second active layer 4, the second active layer 4 may be prevented from interfering with the vias.

In S300, referring to FIG. 4d, first vias 14 each penetrating at least a portion of the second functional layer 5 and at least a portion of the first functional layer 3 are formed, and the first vias 14 each expose a partial surface of a first active layer 2.

For example, the first functional layer 3 and the second functional layer 5 may be etched by using a photolithography process to form the first vias 14.

It will be noted that, referring to FIG. 4d, the first via 14 may penetrate the at least a portion of the first functional layer 3, i.e., the first gate insulating layer 6, the second gate insulating layer 8 and the third gate insulating layer 10, and may penetrate the fifth gate insulating layer 13 of the second functional layer 5.

The first vias 14 each expose the partial surface of the first active layer 2, so that it is possible to facilitate later formation of a source and a drain of a transistor in respective first vias 14, and the source and the drain are each in contact with the partial surface of the first active layer 2 to form an electrical connection.

For example, the number of the first vias 14 is set to correspond to the number of the first active layers 2.

The number of the first vias 14 is twice, three times, four times, the number of the first active layers 2. For example, the number of the first active layers 2 is two, and the number of the first vias 14 is four, six, or eight. For another example, the number of the first active layers 2 is six, and the number of the first vias 14 is twelve, eighteen, or twenty-four.

Figures 1, 4E, 4F:
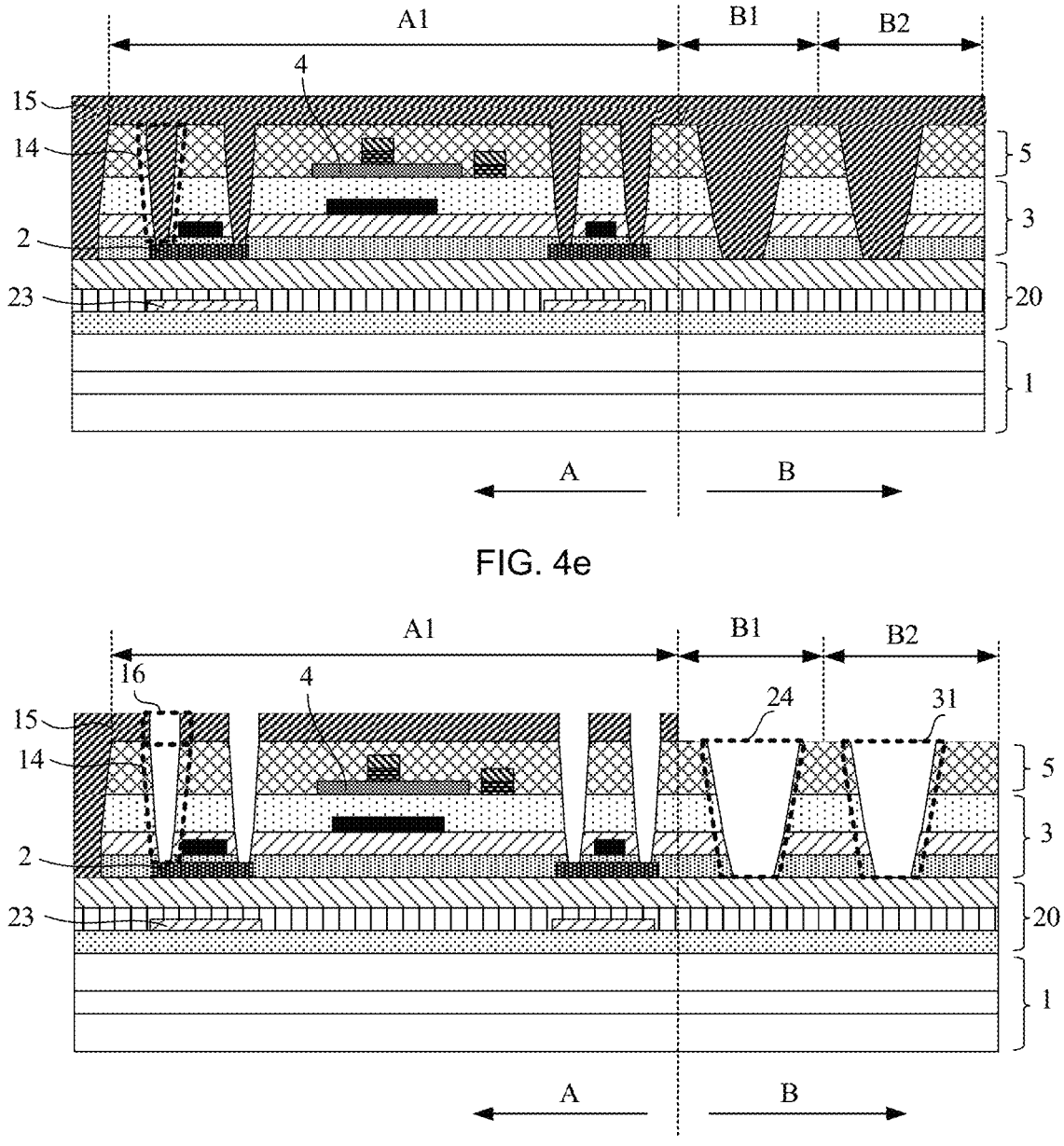

In S400, referring to FIG. 4e, an interlayer dielectric layer 15 is formed on the second functional layer 5, and a portion of the interlayer dielectric layer 15 is filled in the first vias 14.

For example, a material of the interlayer dielectric layer 15 includes an organic material. For example, the material of the interlayer dielectric layer 15 includes polyimide (PI).

For example, a method of forming the interlayer dielectric layer 15 includes a coating process.

It will be noted that, since the organic material has fluidity, in a process of forming the interlayer dielectric layer 15 on the second functional layer 5, the portion of the interlayer dielectric layer 15 is filled in the first vias 14, and an upper surface of the interlayer dielectric layer 15 is a planar surface.

In S500, referring to FIGS. 4f-1 and 4f-2, the portion of the interlayer dielectric layer 15 that is filled in the first vias 14 is removed, and second vias 16 that are respectively communicated with the first vias 14 are formed in the interlayer dielectric layer 15.

For example, a method of removing the portion of the interlayer dielectric layer 15 that is filled in the first vias 14 and forming the second vias 16 that are respectively communicated with the first vias 14 in the interlayer dielectric layer 15 may include a photolithography process.

Furthermore, removing the portion of the interlayer dielectric layer 15 that is filled in the first vias 14 and forming the second vias 16 that are respectively communicated with the first vias 14 in the interlayer dielectric layer 15 may be performed in the same process, so that the manufacturing process of the display substrate 100 may be simplified.

For example, an aperture diameter of the second via 16 is greater than an aperture diameter of the first via 14. Here, an aperture diameter refers to, for example, an average aperture diameter of a via, or an aperture diameter of an end of the via away from the substrate 1.

The first via 14 is communicated with the second via 16, and thus, it is possible to expose the partial surface of the first active layer 2, which facilitates later formation of the source or the drain of the transistor in the first via 14 and second via 16, so that the first active layer 2 is in contact with the source or drain formed in the first via 14 and the second via 16 to form the electrical connection.

It will be noted that, after S500, with reference to FIGS. 4e, 4f-1, and 4f-2, the material of the interlayer dielectric layer 15 may remain on the partial surface of the first active layer 2 exposed through the first via 14 and the second via 16, so that the display substrate may be cleaned by using a cleaning agent to remove the material of the interlayer dielectric layer 15 remaining on the exposed partial surface of the first active layer 2. Thus, after the source and the drain of the transistor are formed on the first active layer 2, a contact resistance between the source of the transistor and the first active layer 2 and a contact resistance between the drain of the transistor and the first active layer 2 may be reduced, so that electrical characteristics of the finally formed transistor including the first active layer 2 may be prevented from being affected, thereby improving the display effect of the display substrate.

Figures 2, 4F, 4G:
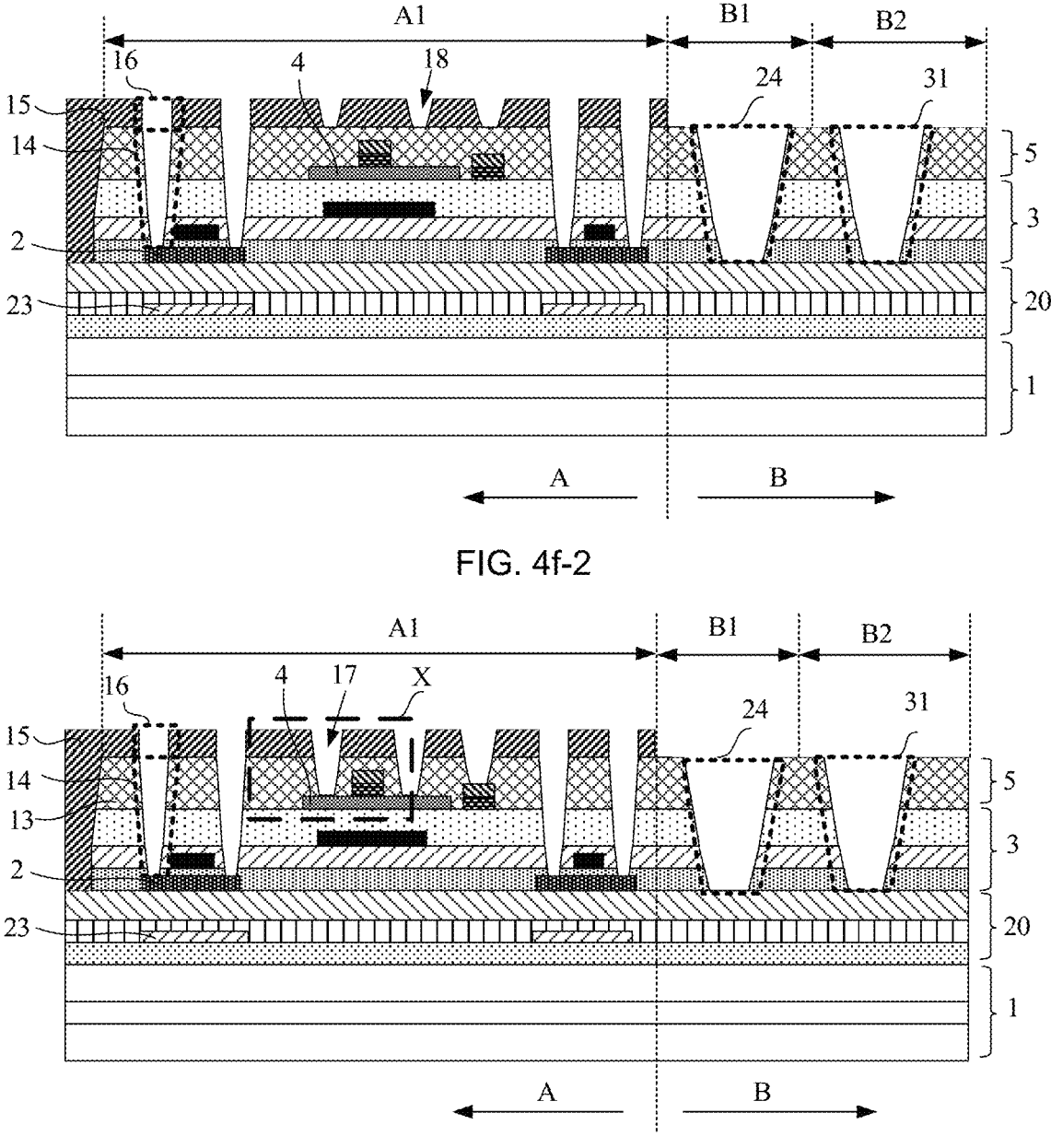

In S600, referring to FIG. 4g, third vias 17 each penetrating the interlayer dielectric layer 15 and at least a portion of the second functional layer 5 are formed, and the third vias 17 each expose a partial surface of a second active layer 4.

For example, a method of forming the third vias 17 each penetrating the interlayer dielectric layer 15 and the at least a portion of the second functional layer 5 includes a photolithography process.

It will be noted that, referring to FIG. 4g, the third via 17 penetrates the at least a portion of the second functional layer 5, i.e., the fifth gate insulating layer 13.

For example, the aperture diameter of the first via 14 is less than an aperture diameter of the third via 17.

The third vias 17 each expose the partial surface of the second active layer 4, so that it is possible to facilitate later formation of a source and a drain of a transistor in respective third vias 17 in a subsequent step, and the source and drain are each in contact with the partial surface of the second active layer 4 to form an electrical connection.

Since the third vias 17 are formed after the first vias 14 and the second vias 16, referring to FIG. 4g, in the process of removing the material of the interlayer dielectric layer 15 that remains on the partial surface of the first active layer 2 through the first via 14 and the second via 16 by using the cleaning agent, the second functional layer 5 on the second active layer 4 may protect the second active layer 4 from corrosion caused by exposure of the second active layer 4 to the cleaning agent.

Thus, in the manufacturing method of the display substrate provided in some embodiments of the present disclosure, after the first vias 14 each penetrating the at least a portion of the second functional layer 5 and the at least a portion of the first functional layer 3 and each exposing the partial surface of the first active layer 2 are formed firstly, the interlayer dielectric layer 15 is formed on the second functional layer 5, and then the third vias 17 each penetrating the interlayer dielectric layer 15 and the at least a portion of the second functional layer 5 are formed. In this way, before the third vias 17 are formed, the display substrate may be cleaned by using the cleaning agent to remove the material of the interlayer dielectric layer 15 remaining on the exposed partial surface of the first active layer 2. Therefore, the second functional layer 5 may be used to protect the second active layer 4 from corrosion caused by the exposure of the second active layer 4 to the cleaning agent, and the contact resistance between the source and the first active layer 2 and the contact resistance between the drain and the first active layer 2 may be prevented from being increased after the source and the drain are formed on the first active layer 2 in the subsequent process, so that the electrical characteristics of the finally formed transistor and the display effect of the display substrate may be prevented from being affected.

The manufacturing method of the display substrate in the present disclosure was verified. A verification method includes as follows: ① the display substrate was manufactured by using the manufacturing method, and electrical characteristics of a transistor (considering a driving transistor as an example) including the first active layer 2 formed in the display substrate were tested; ② the display substrate was manufactured by using one of the above implementations, and electrical characteristics of a transistor (considering a driving transistor as an example) including the first active layer 2' formed in the display substrate were tested. A width to length ratio of a channel of each of the transistors formed in the two manufacturing methods is, for example, 3/23.

TABLE 1

| | Electrical characteristics of transistor (with width to length ratio of 3/23) | | |
|---|---|---|---|
| Item | Standard | Implementation | Present disclosure |
| Mobility (cm$^2$/Vs) | 80 to 130 | 5 | 135 |
| Contact resistance (Ω) | <2000 | 603662 | 1358 ± 389 |

Referring to Table 1 above, in standards of electrical characteristic of a transistor, a standard requirement for mobility is in a range of 80 cm$^2$/Vs to 130 cm$^2$/Vs, and a standard requirement for a contact resistance of a transistor (i.e., a contact resistance between an active layer and a source of the transistor or a contact resistance between the active layer and a drain of the transistor) is less than 2000Ω.

In the display substrate manufactured by using the implementation, the mobility of the transistor is 5 cm$^2$/Vs, which is not in the standard requirement range of mobility compared to the standard requirement for mobility (80 cm$^2$/Vs to 130 cm$^2$/Vs). That is, the mobility of the transistor does not meet the standard. The contact resistance of the transistor is 603662Ω, which is not in the standard requirement range of contact resistance compared to the standard requirement for contact resistance (<2000Ω). That is, the contact resistance of the transistor does not meet the standard.

In the display substrate manufactured by using the manufacturing method, the mobility of the transistor is 135 cm$^2$/Vs, which is in the standard requirement range of mobility compared to the standard requirement for mobility (80 cm$^2$/Vs to 130 cm$^2$/Vs). That is, the mobility of the transistor in the present disclosure substantially meets the standard. The contact resistance of the transistor is 1358±389Ω, which is in the standard requirement range of contact resistance compared to the standard requirement for contact resistance (<2000Ω). That is, the contact resistance of the transistor in the present disclosure meets the standard.

Thus, it is proved that the manufacturing method of the display substrate in the present disclosure may effectively increase the mobility of the manufactured transistor, and may effectively reduce the contact resistance between the active layer and the source of the transistor and the contact resistance between the active layer and the drain of the transistor.

In some embodiments, with reference to FIGS. 4e, 4f-1 and 4f-2, in S500, in the process of removing the portion of the interlayer dielectric layer 15 that is filled in the first vias 14 and forming the second vias 16 that are respectively communicated with the first vias 14 in the interlayer dielectric layer 15, the manufacturing method of the display substrate further includes S510.

In S510, fourth vias 18 each penetrating the interlayer dielectric layer 15 are formed. An orthographic projection of a fourth via 18 on the substrate 1 is located within an orthographic projection of a second active layer 4 on the substrate 1.

For example, the interlayer dielectric layer 15 may be etched by using a photolithography process to form the fourth vias 18.

The orthographic projection of the fourth via 18 on the substrate 1 is located within the orthographic projection of the second active layer 4 on the substrate 1, so that it is possible to facilitate formation of following fifth vias 19 each penetrating at least a portion of the second functional layer 5 through respective fourth vias 18 subsequently.

For example, the number of the fourth vias 18 is set to correspond to the number of the second active layer(s) 4.

The number of the fourth vias 18 is twice the number of the second active layer(s) 4. For example, the number of the second active layers 4 is two, and the number of the fourth vias 18 is four. For another example, the number of the second active layers 4 is six, and the number of the fourth vias 18 is twelve.

Figure 5:
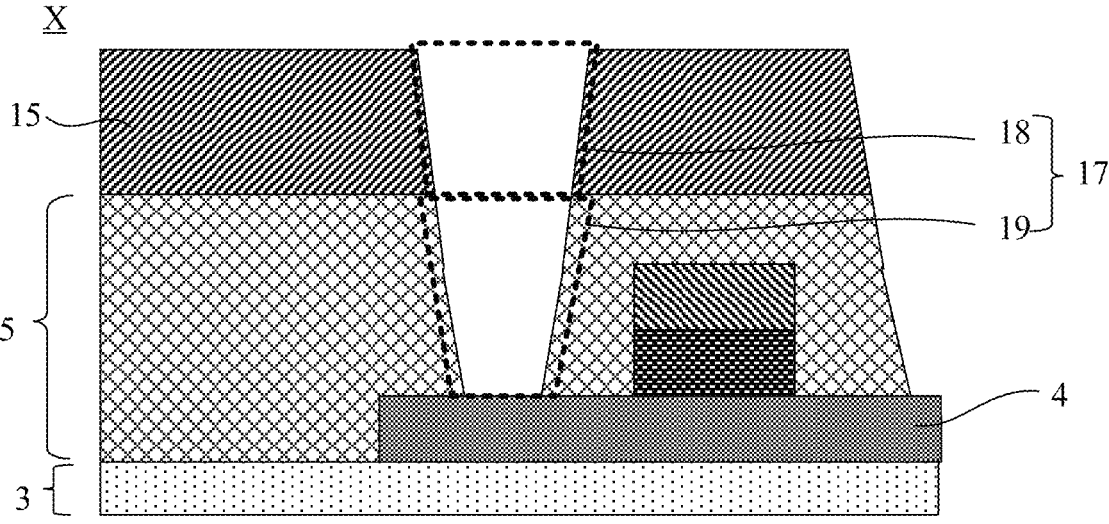
FIG. 5 is a partial enlarged view of the X region in FIG. 4g.

In this case, in S600, with reference to FIGS. 4g and 5, the step of forming the third vias 17 each penetrating the interlayer dielectric layer 15 and the at least a portion of the second functional layer 5 includes S610.

In S610, referring to FIG. 5, the second functional layer 5 is patterned through the fourth vias 18 to form the fifth vias 19 each penetrating the at least a portion of the second functional layer 5. A third via 17 includes a fourth via 18 and a fifth via 19.

For example, a process of forming the fourth vias 18 each penetrating the interlayer dielectric layer 15 may include a photolithography process.

The fourth vias 18 each penetrating the interlayer dielectric layer 15 are formed, so that the film thickness of the display substrate at the fourth vias 18 may be reduced, which is conducive to a subsequent film thickness to be etched when the second functional layer 5 is patterned through the fourth vias 18.

With reference to FIGS. 4e and 5, the second functional layer 5 is patterned through the fourth vias 18 each penetrating the interlayer dielectric layer 15, so as to form the fifth vias 19 each penetrating the at least a portion of the second functional layer 5, so that the fourth via 18 and the fifth via 19 may be communicated with each other, thereby forming the third via 17 including the fourth via 18 and the fifth via 19 to expose the partial surface of the second active layer 4, which is conducive to forming a following first conductive film in the third vias 17 in a subsequent process and coupling the first conductive film to the partial surface of the second active layer 4.

For example, a method of patterning the second functional layer 5 includes a photolithography process. An aperture diameter of the fourth via 18 is, for example, greater than an aperture diameter of the fifth via 19.

In some other examples, with reference to FIGS. 4e and 4f-1, the fourth via 18 may not be formed during the removal of the portion of the interlayer dielectric layer 15 that is filled in the first vias 14. In this case, in S600, in the process of forming the third vias 17 each penetrating the interlayer dielectric layer 15 and the at least a portion of the second functional layer 5, the interlayer dielectric layer 15 and the second functional layer 5 need to be etched synchronously.

In some examples, referring to FIG. 4b, before the first active layers 2, the first functional layer 3, the second active layer(s) 4 and the second functional layer 5 are formed in sequence on the substrate 1, the manufacturing method of the display substrate further includes: forming an inorganic layer 20 on the substrate 1. The first active layers 2 are formed on the inorganic layer 20.

For example, the inorganic layer 20 includes a barrier layer 21 and a first buffer layer 22. The inorganic layer 20 is used for protecting the display substrate.

For example, a method of forming the inorganic layer 20 may include forming the barrier layer 21 and the first buffer layer 22 in sequence on the substrate 1.

For example, the barrier layer 21 and the first buffer layer 22 are each made of an inorganic material.

For example, the barrier layer 21 may, for example, be of a single-layer structure, and the material of the barrier layer 21 may include, for example, silicon oxide (SiO). The first buffer layer 22 may, for example, be of a double-layer structure, and a material of each layer in the double-layer structure of the first buffer layer 22 may include one of silicon oxide (SiO) and silicon nitride (SiN).

For example, in a process of forming the barrier layer 21 and the first buffer layer 22 in sequence on the substrate 1, the manufacturing method of the display substrate further includes: forming light-shielding layers 23 located between the barrier layer 21 and the first buffer layer 22. An orthographic projection of a first active layer 2 on the substrate 1 is located within an orthographic projection of a light-shielding layer 23 on the substrate 1.

For example, the light-shielding layer 23 is used for shielding light traveling to the first active layer 2 from a side of the substrate 1 away from the first active layer 2. A material of the light-shielding layer 23 may include, for example, metal or a black organic material.

It will be understood that electrical characteristics of the first active layer 2 are greatly affected by light. The orthographic projection of the first active layer 2 on the substrate 1 is set to be within the orthographic projection of the light-shielding layer 23 on the substrate 1, so that the light-shielding layer 23 may be used to shield the light traveling to the first active layer from the side of the substrate 1 away from the first active layer, so as to prevent the light from affecting the electrical characteristics of the first active layer 2.

In some embodiments, referring to FIG. 4b, the substrate 1 has a display area A and a non-display area B. The non-display area includes a bending area (also referred to as pad bending area) B1. The first active layers 2 and the second active layer(s) 4 are located in the display area A.

For example, the display area A is an area for displaying images. The non-display area B is an area except the display area A.

The bending area B1 is an area where bending may be performed in the manufactured display substrate. The display substrate is bent at the bending area, so that a portion of the display substrate may be bent to the side of the substrate 1 away from the first active layer 2. In this way, a space occupied by the display substrate on a plane where the display substrate is located may be reduced.

In some examples, in S300 above, in a process of forming the first vias 14 each penetrating the at least a portion of the second functional layer 5 and the at least a portion of the first functional layer 3, the manufacturing method of the display substrate further includes S310a.

In S310a, referring to FIG. 4d, first groove(s) 24 each penetrating at least a portion of the second functional layer 5 and at least a portion of the first functional layer 3 are formed, and the first groove(s) 24 are located in the bending area, and each expose a partial surface of the inorganic layer 20.

For example, referring to FIGS. 4c and 4d, a portion of the first functional layer 3 and a portion of the second functional layer 5 that are located in the first vias 14 need to be removed in the process of forming the first vias 14, and a portion of the first functional layer 3 and a portion of the second functional layer 5 that are located in the first groove(s) 24 need to be removed in the process of forming the first groove(s) 24. In the process of forming the first vias 14 and in the process of forming the first groove(s) 24, the same film layers are partially removed. The first groove(s) 24 are formed in the process of forming the first vias 14, so that the first vias 14 and the first groove(s) 24 may be formed in one patterning process, which simplifies the manufacturing process of the display substrate 100.

Furthermore, the first groove(s) 24 are formed, so that a thickness of the display substrate at the bending area B1 may be reduced, which is conducive to continuously removing a portion of the inorganic layer 20 located at the bending area B1 subsequently.

It will be understood that after the first groove(s) 24 are formed in the display substrate, in S400 above, in the process of forming the interlayer dielectric layer 15 on the second functional layer 5, with reference to FIGS. 4d and 4e, a portion of the interlayer dielectric layer 15 is filled in the first groove(s) 24. In S500 later, referring to FIGS. 4f-1 and 4f-2, in the process of removing the portion of the interlayer dielectric layer 15 that is filled in the first vias 14, the portion of the interlayer dielectric layer 15 that is filled in the first groove(s) 24 is also removed.

In some embodiments, the manufacturing method of the display substrate further includes S700 to S800.

Figure 4H:
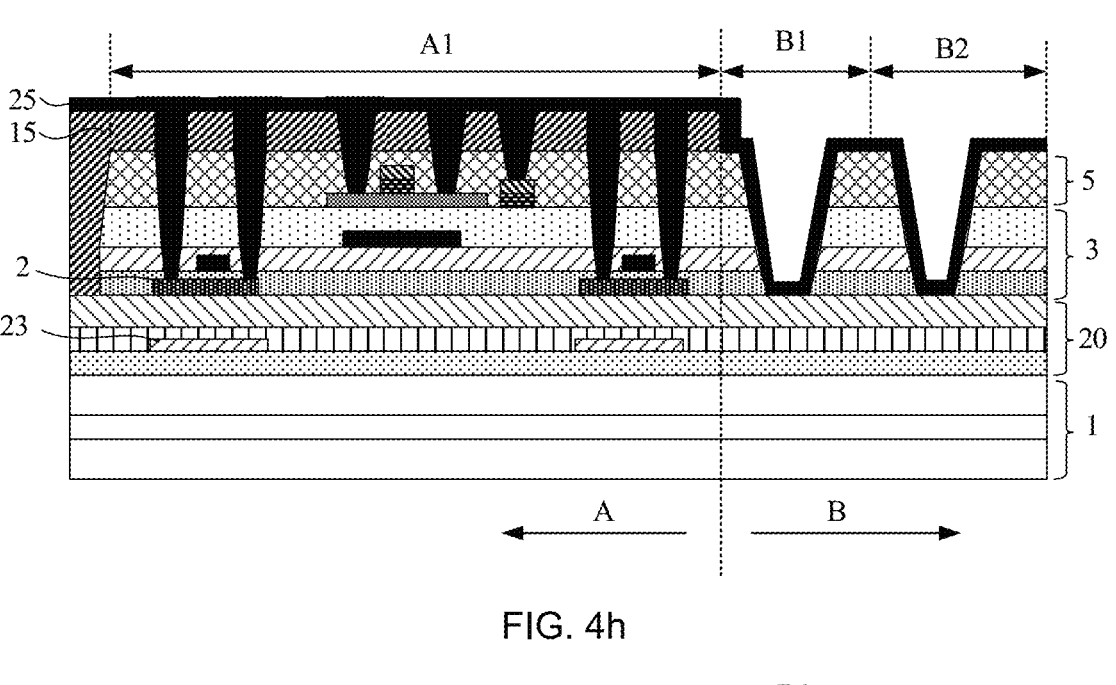

In S700, referring to FIG. 4h, the first conductive film 25 is formed on the interlayer dielectric layer 15, and the first conductive film 25 covers a surface of the interlayer dielectric layer 15 and is located in the first vias 14, the second vias 16, the third vias 17 and the first groove(s) 24.

Figure 4I:
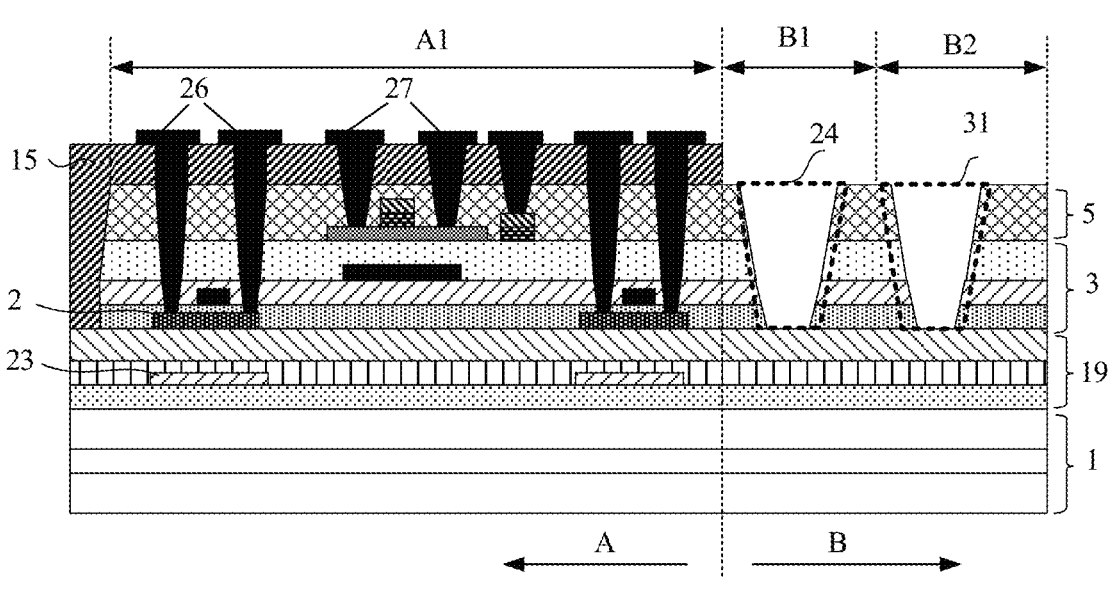

In S800, with reference to FIGS. 4h and 4i, the first conductive film 25 is pattern, so that a portion of the first conductive film 25 located in the first vias 14 and the second vias 16 is retained to obtain first conductive patterns 26, and a portion of the first conductive film 25 located in the third vias 17 is retained to obtain second conductive patterns 27.

For example, a material of the first conductive film 25 may include a titanium (Ti), aluminum (Al) and titanium (Ti) stacked in sequence.

For example, a process of forming the first conductive film 25 on the interlayer dielectric layer 15 may include, for example, a metal sputtering process.

It will be noted that, the metal sputtering process is to bombard a surface of a metal target with high-energy particles (e.g., ions, or neutral atoms or molecules), so that atoms or molecules close the surface of the metal target obtain enough energy to finally escape from the surface of the metal target. Sputtering can only be performed under a certain vacuum condition.

Referring to FIG. 4h, the display substrate to be formed is placed in a sputtering chamber, and the material of the first conductive film 25 is formed on the interlayer dielectric layer 15, and is formed in the first vias 14, the second vias 16, the third vias 17, and the first groove(s) 24 by a sputtering process.

For example, a method of patterning the first conductive film 25 includes a photolithography process.

It will be noted that, with reference to FIGS. 4g, 4h and 4i, the first conductive pattern 26 is in contact with the first active layer 2, and different first conductive patterns 26 respectively constitute a source and a drain of a transistor.

The second conductive pattern 27 is in contact with the second active layer 4, and different second conductive patterns 27 respectively constitute a source and a drain of a transistor.

In an implementation, referring to FIG. 1, in a process of forming the first connection holes 6' each exposing the first active layer 2' and the second connection holes 7' exposing the second active layer 4' at the corresponding positions of the second functional layer 5', a bending groove 9' located at a bending area B1' (located in a non-display area B' of the display substrate) is formed. The bending groove 9' penetrates the second functional layer 5' and the first functional layer 3', and exposes a partial surface of the substrate 1'. A material of the substrate 1' includes polyimide (PI), and the substrate 1' easily absorbs water vapor during the manufacturing the display substrate.

Figure 6A:
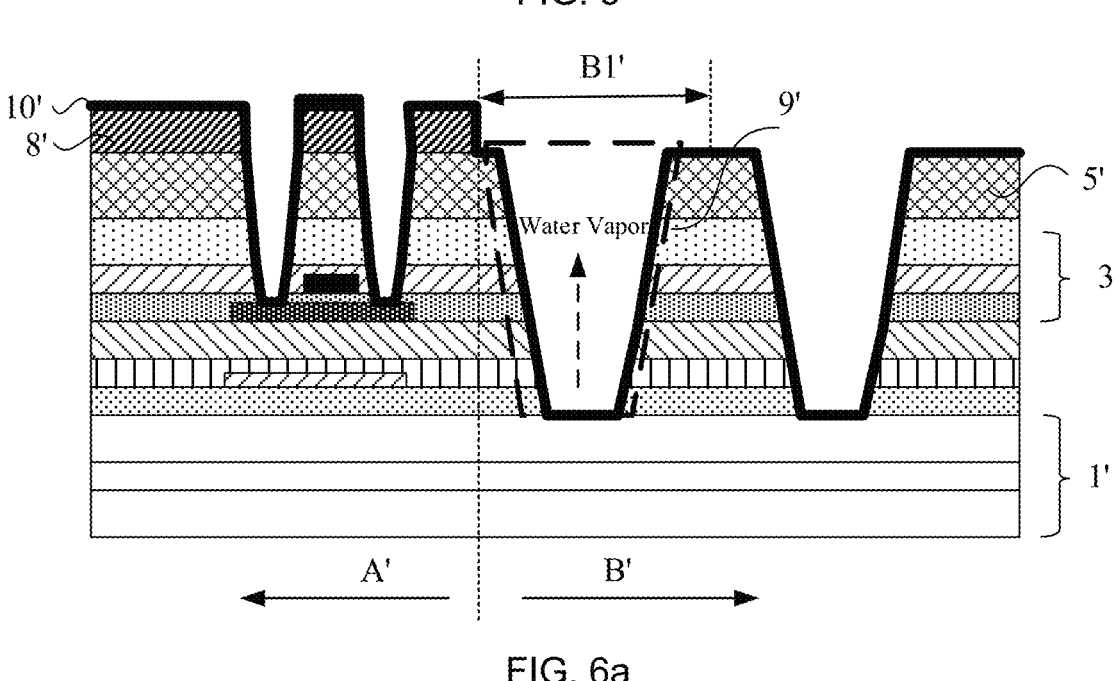
FIG. 6a is a schematic diagram of release of water vapor from a substrate in an implementation.
Figure 6B:
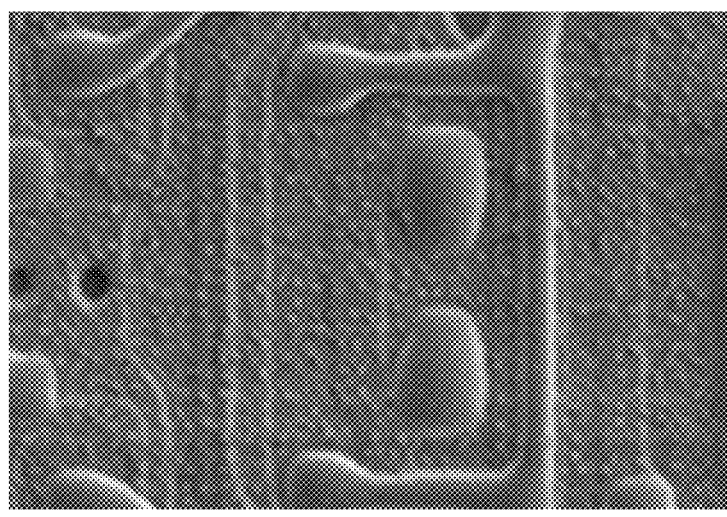
FIG. 6b is an optical inspection diagram of a structure formed by a first conductive film in an implementation.
Figure 6C:
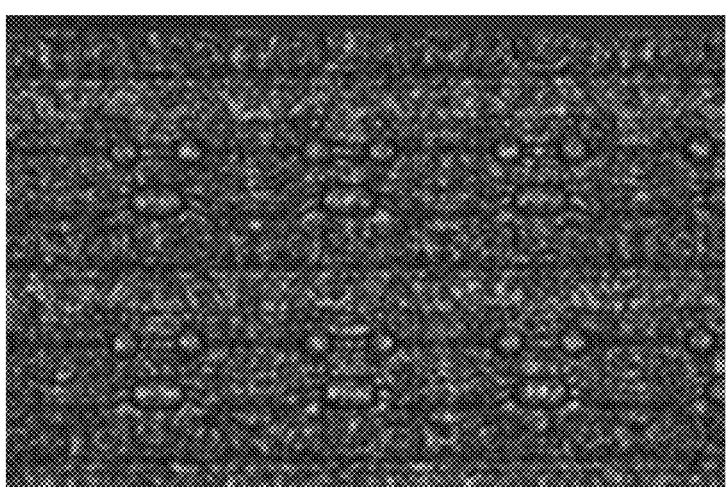
FIG. 6c is an optical inspection diagram of a structure formed by another first conductive film in an implementation.

Therefore, with reference to FIGS. 2 and 6a, in a process of forming a first conductive film 10' on the interlayer dielectric layer 8' by a sputtering process, water vapor absorbed by the substrate 1' is easily diffused into a sputtering chamber. The release of water vapor affects bombardment and deposition of high-energy particles in the sputtering process on a metal target, which results in, referring to FIG. 6b, small protrusions on the finally formed first conductive film 10', thereby affecting a film forming quality of the finally formed first conductive film 10' and finally affecting a quality of a structure obtained by etching the first conductive film 10'. Referring to FIGS. 6b and 6c, the structure obtained by etching the first conductive film 10' has too many small protrusions, so that the structure obtained by etching the first conductive film 10' exhibits a plurality of "small black spots" in optical inspection.

In order to solve the above problem, in a related solution, the display substrate to be formed is preheated firstly in a chemical vapor deposition (CVD) chamber before the first conductive film 10' is formed on the surface of the second functional layer 5'. Preheating conditions are that a preheating temperature is 150° C. and a preheating duration is 30 minutes. Water vapor absorbed by the substrate 1' is removed by preheating. However, for this solution, the manufacturing process of the display substrate is increased, the manufacturing duration of the display substrate is increased, and the manufacturing cost of the display substrate is also increased.

Figure 6D:
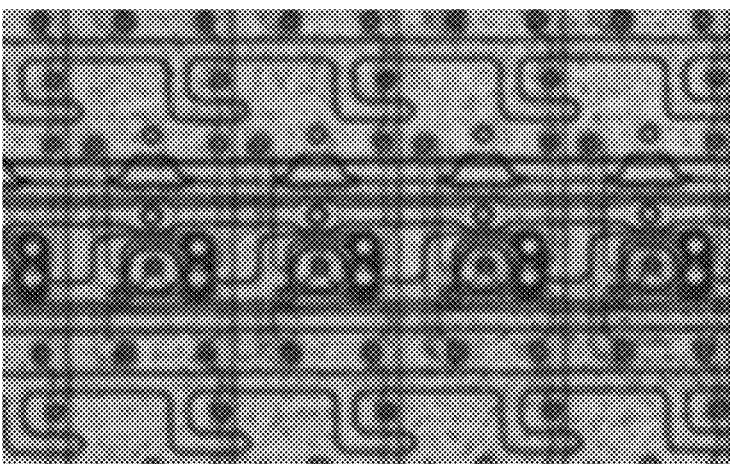
FIG. 6d is an optical inspection diagram of first conductive patterns and second conductive patterns, in accordance with some embodiments of the present disclosure.

However, referring to FIGS. 4f-1, 4f-2 and 4g, before the first conductive film 25 is formed by the sputtering process, the first groove 24 located at the bending area B1 penetrates only the at least a portion of the second functional layer 5 and the at least a portion of the first functional layer 3, and exposes the inorganic layer 20, and the inorganic layer 20 covers the substrate 1. In the process of forming the first conductive film 25 by the sputtering process, even if the substrate 1 absorbs water vapor, the inorganic layer 20 can block the water vapor in the substrate 1, so that the water vapor in the substrate 1 is prevented from being released into the sputtering chamber, thereby ensuring a film forming quality of the first conductive film 25. Referring to FIG. 6d, surfaces of the first conductive patterns 26 and the second conductive patterns 27 formed by using the manufacturing method do not exhibit "small black spots".

In some embodiments, a contact resistance between the first conductive pattern 26 and the first active layer 2 is in a range of 969Ω to 1747Ω, inclusive.

For example, the contact resistance between the first conductive pattern 26 and the first active layer 2 may be 969 Ω, 1100 Ω, 1300 Ω, 1358Ω, or 1747Ω.

In some embodiments, the manufacturing method of the display substrate further includes S900 and S1000.

Figures 4J, 4K:
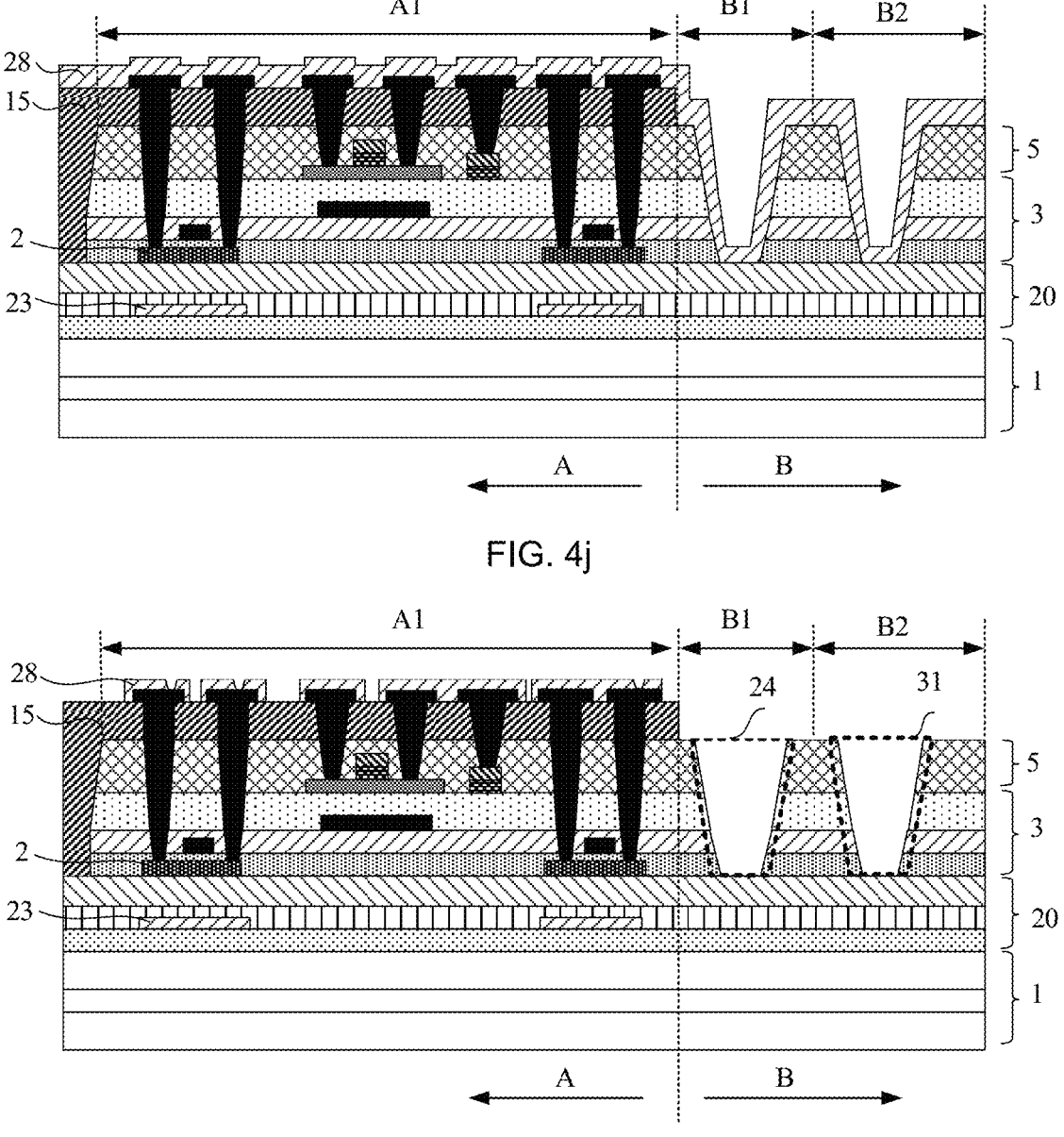

In S900, with reference to FIGS. 4i and 4j, a passivation layer 28 is formed on the first conductive patterns 26 and the second conductive patterns 27, and a portion of the passivation layer 28 is located in the first groove(s) 24, and is in contact with the exposed partial surface of the inorganic layer 20.

In S1000, referring to FIG. 4k, the passivation layer 28 is patterned to remove at least the portion of the passivation layer 28 located in the first groove(s) 24.

For example, the passivation layer 28 is used for providing insulation protect to the first conductive patterns 26 and the second conductive patterns 27. A material of the passivation layer 28 may include an inorganic material. For example, the material of the passivation layer 28 includes silicon oxide (SiO).

For example, a method of forming the passivation layer 28 on the first conductive patterns 26 and the second conductive patterns 27 includes a deposition process.

It will be understood that, referring to FIGS. 4i and 4j, since the first groove(s) 24 are formed before the passivation layer 28 is formed, the portion of the passivation layer 28 is also formed in the first groove(s) 24 during the formation of the passivation layer 28, and the portion of the passivation layer 28 formed in the first groove(s) 24 is in contact with the exposed partial surface of the inorganic layer 20.

For example, a method of patterning the passivation layer 28 includes a photolithography process.

Figures 7, 8A:
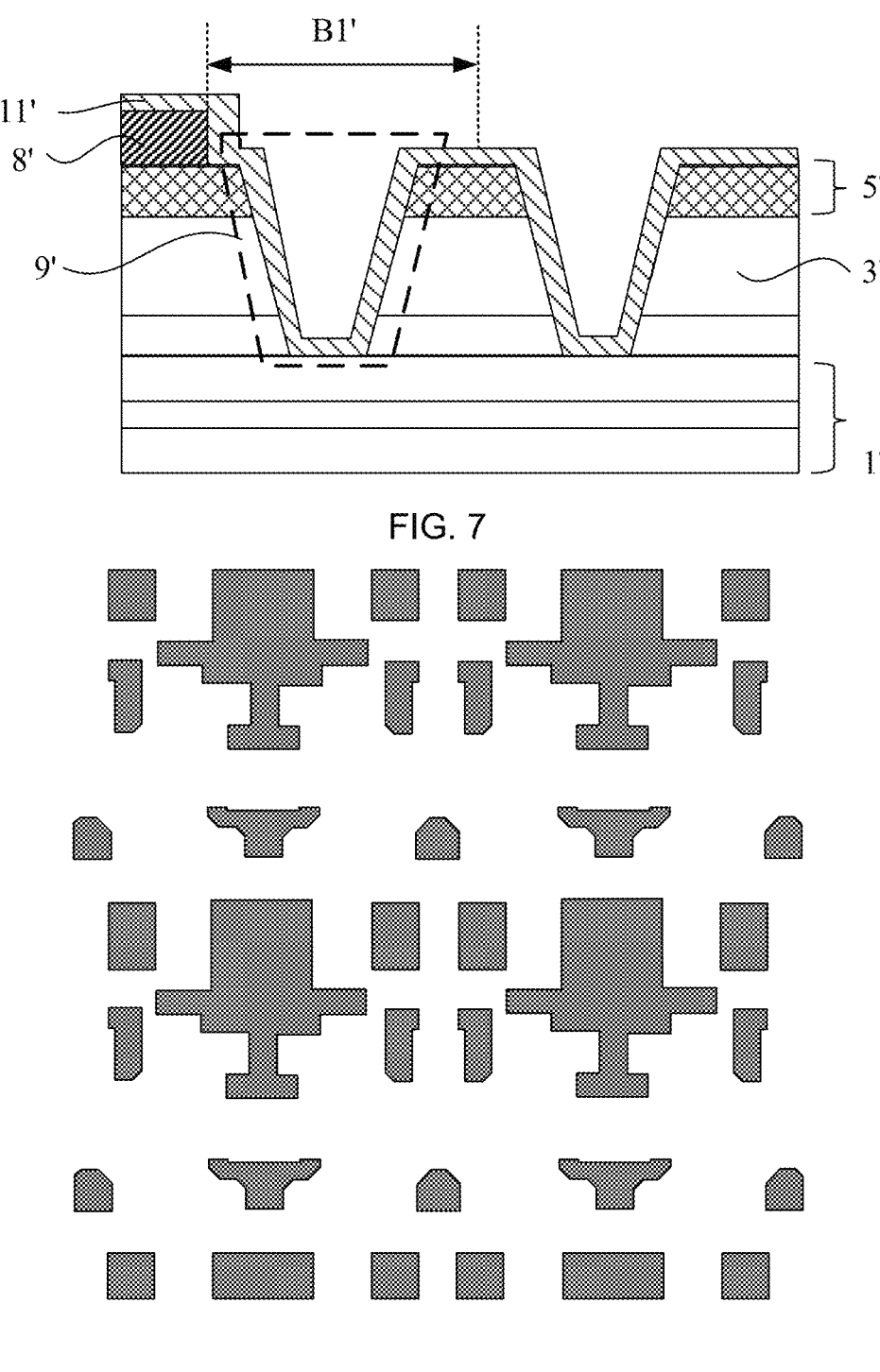
FIG. 7 is a sectional view of yet another display substrate to be formed in an implementation.
FIGS. 8a to 8d are top views of a display substrate to be formed, in accordance with some embodiments of the present disclosure.

In an implementation, as described above, in the process of forming the first connection holes 6' each exposing the first active layer 2' and the second connection holes 7' exposing the second active layer 4' at the corresponding positions of the second functional layer 5', referring to FIG. 2, the bending groove 9' located at the bending area B1' is formed. The bending groove 9' penetrates the second functional layer 5' and the first functional layer 3', and exposes the partial surface of the substrate 1'. With reference to FIGS. 1 and 7, after the first conductive film 10' is formed in the first connection holes 6' and the second connection holes 7' and is etched, a passivation layer 11' is formed. Therefore, referring to FIG. 7, the passivation layer 11' is formed on a partial surface of the substrate 1' that is exposed. Moreover, in an implementation, a portion of the passivation layer 11' located in the bending groove 9' is not removed in a process of patterning the passivation layer 11'. A photoresist used as a mask needs to be removed in the process of patterning the passivation layer 11', and a material of the passivation layer 11' includes an inorganic material, and the material of the substrate 1' includes an organic material, which results in poor adhesion between the passivation layer 11' and the substrate 1'. Therefore, the portion of the passivation layer 11' located in the bending groove 9' may be peeled off from the substrate 1' along with the removal of the photoresist, and fragments of the peeled passivation layer may enter a display area A' of the display substrate, which results in poor display of the display substrate.

However, referring to FIG. 4k, in a process of patterning the passivation layer 28, the portion of the passivation layer 28 located in the first groove(s) 24 is removed, so that in the manufacturing method of the display substrate, a case that the passivation layer 28 is peeled off as described in the above implementation may be avoided, so as to avoid poor display of the display substrate.

Moreover, before the passivation layer 28 is formed, the inorganic layer 20 covers a portion of the substrate 1 in the first groove(s) 24, and the material of the passivation layer 28 includes the inorganic material, so that the passivation layer 28 has strong adhesion to the inorganic layer 20. Even if the portion of the passivation layer 28 located in the first groove(s) 24 is not removed in S1000, the passivation layer 28 may be prevented from entering the display area A of the display substrate due to peeling off from the inorganic layer 20 in a subsequent cleaning step after the passivation layer 28 is patterned, thereby avoiding the poor display of the display substrate.

On another hand, at least the portion of the passivation layer 28 located in the first groove(s) 24 is removed, which is conducive to patterning the inorganic layer 20 exposed through the first groove(s) 24 subsequently. It will be understood that the more inorganic layers in the display substrate, the greater rigidity of the display substrate and the less resistant to deformation. Therefore, in the process of patterning the passivation layer 28, at least the portion of the passivation layer 28 located in the first groove(s) 24 is removed to maximize the removal of the inorganic layer in the display substrate, so that the rigidity of the display substrate may be reduced, thereby increasing the deformation resistance of the display substrate.

Figures 4L, 4M:
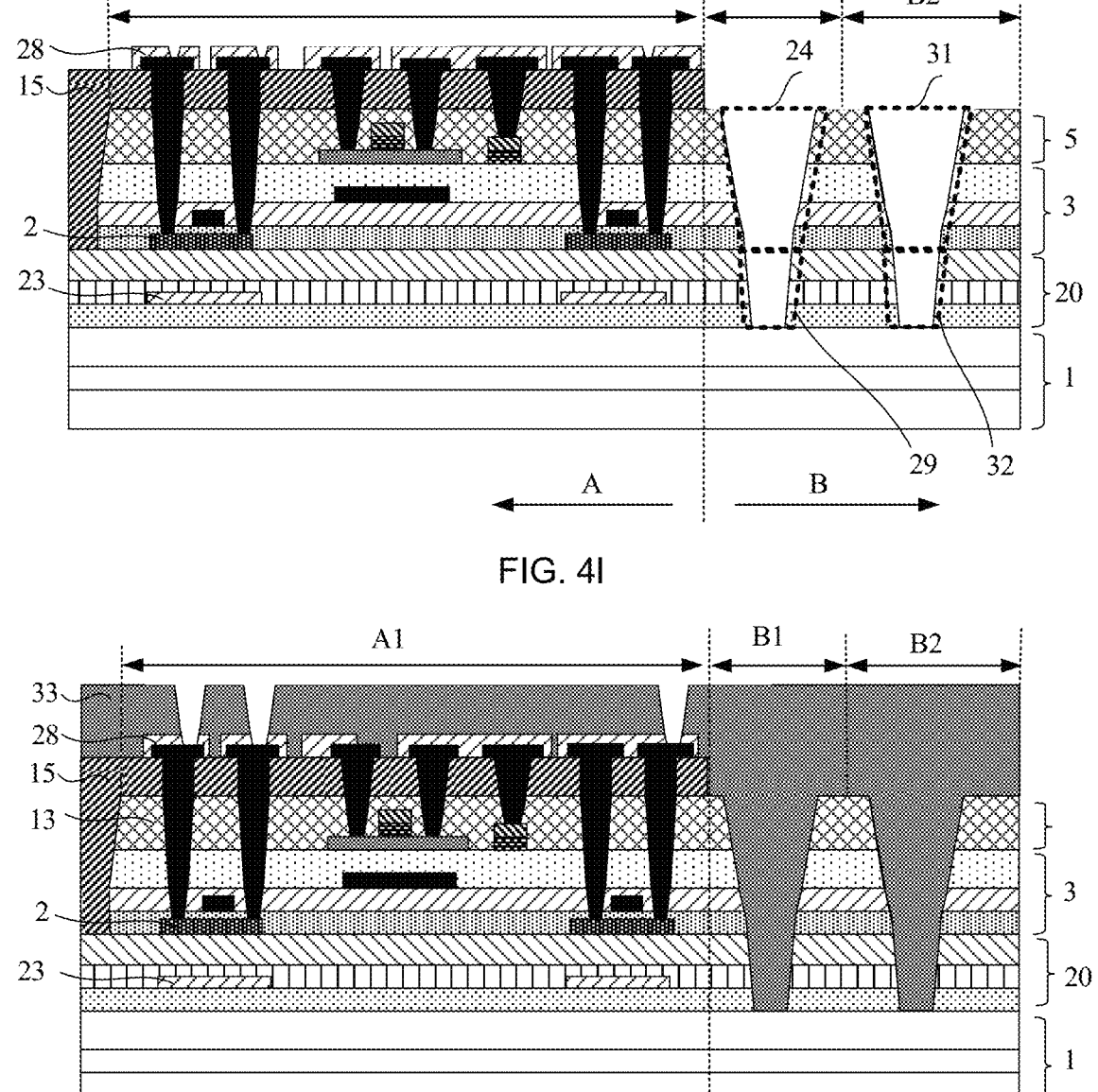

In some embodiments, with reference to FIGS. 4k, 4l and 4m, the manufacturing method of the display substrate further includes S1100a and S1200a.

In S1100a, the inorganic layer 20 is patterned through the first groove(s) 24 to form second groove(s) 29 that are respectively communicated with the first groove(s) 24, and the second groove(s) 29 each expose a partial surface of the substrate 1.

In S1200a, a first planarization layer 33 is formed, and a portion of the first planarization layer 33 is filled in the first groove(s) 24 and the second groove(s) 29, and is in contact with the exposed partial surface of the substrate 1.

For example, a method of patterning the inorganic layer 20 includes a photolithography process.

The second groove 29 communicated with the first groove 24 is formed, and the second groove 29 exposes the partial surface of the substrate 1, so that a portion of each film layer in the first groove 24 and the second groove 29 may be completely removed, so as to reduce a film thickness of the inorganic layer at the bending area B1. Thus, more organic materials may be filled at the bending area B1 in subsequent steps, so that the deformation resistance of the display substrate 100 is increased.

For example, the first planarization layer 33 is used for forming a planar surface, which is conducive to forming other film layers on the first planarization layer 33.

For example, a material of the first planarization layer 33 may include an organic material. For example, the material of the first planarization layer 33 includes polyimide (PI).

For example, a method of forming the first planarization layer 33 includes a coating process.

The portion of the first planarization layer 33 is filled in the first groove 24 and second groove 29, and is in contact with the exposed partial surface of substrate 1, so that the material of the first planarization layer may be filled in the bending area B1 as much as possible, thereby enhancing the bending ability of the bending area B1 in the at the first groove 24 and the second groove 29.

In some embodiments, referring to FIG. 4d, the non-display area B further includes a cutting area B2 located on a side of the bending area B1 away from the display area A.

In the process of forming the first groove(s) 24 each penetrating the at least a portion of the second functional layer 5 and the at least a portion of the first functional layer 3 in S310a, the manufacturing method of the display substrate further includes S310b.

In S310b, referring to FIG. 4d, third groove(s) 31 each penetrating at least a portion of the second functional layer 5 and at least a portion of the first functional layer 3 are formed. The third groove(s) 31 are located at the cutting area B2, and each expose a partial surface of the inorganic layer 20.

For example, the cutting area B2 is used for cutting the display substrate.

For example, the substrate may be used for forming a display mother board, and the display mother board has a plurality of display areas A and non-display areas B that are correspondingly arranged. The display mother board may be divided into a plurality of display substrates by cutting the display mother board, and the display substrate obtained after cutting have a display area A and a non-display area B.

For example, referring to FIG. 4d, in the process of forming the first groove(s) 24 each penetrating the at least a portion of the first functional layer 3 and the at least a portion of the second functional layer 5, the third groove(s) 31 each penetrating the at least a portion of the first functional layer 3 and the at least a portion of the second functional layer 5 are formed, so that the first groove(s) 24 and the third groove(s) 31 may be formed in one patterning process, thereby simplifying the manufacturing process of the display substrate.

For example, the third groove 31 exposes the partial surface of the inorganic layer 20, so that a thickness of the display substrate 100 at the cutting area B2 may be reduced, which facilitates a subsequent processing of the inorganic layer 20 at the cutting area B2.

It will be understood that after the third groove(s) 31 are formed in the display substrate, in the process of forming the interlayer dielectric layer 15 on the second functional layer 5 in S400, with reference to FIGS. 4d and 4e, a portion of the interlayer dielectric layer 15 is filled in the third groove(s) 31.

In the subsequent S500, referring to FIGS. 4f-1 and 4f-2, in the process of removing the portion of the interlayer dielectric layer 15 that is filled in the first vias 14, the portion of the interlayer dielectric layer 15 that is filled in the third groove(s) 31 is also removed.

Then, with reference to FIGS. 4g and 4h, in the process of forming the first conductive film 25 on the interlayer dielectric layer 15, i.e., in S700, a portion of the first conductive film 25 is formed in the third groove(s) 31. With reference to FIGS. 4g, 4h and 4i, in the process of patterning the first conductive film 25, i.e., in S800, the portion of the first conductive film 25 located in the third groove(s) 31 is also removed.

Then, referring to FIGS. 4j and 4k, in the process of forming the passivation layer 28 on the first conductive patterns 26 and the second conductive patterns 27, i.e., in S900, a portion of the passivation layer 28 is formed in the third groove(s) 31, and is in contact with the exposed partial surface of the inorganic layer 20. In the process of patterning the passivation layer 28, i.e., in S1000, the portion of the passivation layer 28 located in the third groove(s) 31 is also removed.

In some embodiments, with reference to FIGS. 4k, 4l and 4m, the manufacturing method of the display substrate further includes S1100*b* and S1200*b*.

In S1100*b*, the inorganic layer 20 is patterned through the third groove(s) 31 to form fourth groove(s) 32 that are respectively communicated with the third groove(s) 31, and the fourth groove 32 each expose a partial surface of the substrate 1.

In S1200*b*, the first planarization layer 33 is formed, and a portion of the first planarization layer 33 is filled in the third groove(s) 31 and the fourth groove(s) 32, and is in contact with the exposed partial surface of the substrate 1.

For example, a method of patterning the inorganic layer 20 includes a photolithography process.

For example, S1100*a* and S1100*b* may be performed in one patterning process, and S1200*a* and S1200*b* may be performed in one patterning process, which may simplify the manufacturing process of the display substrate.

The fourth groove 32 communicated with the third groove 31 is formed, and the fourth groove 32 exposes the partial surface of the substrate 1, so that a portion of each film layer located in the third groove 31 and the fourth groove 32 may be completely removed, so as to reduce a film thickness of the inorganic layer located at the cutting area B2. Thus, in a subsequent step, the cutting area B2 may be filled with an organic material.

It will be noted that in a case of fracture of the inorganic material, cracks easily propagate to other areas through the inorganic layer. The organic material has good flexibility, and may prevent cracks from propagating to other areas in the case of fracture.

The portion of the first planarization layer 33 is filled in the third groove(s) 31 and the fourth groove(s) 32, and is in contact with the exposed partial surface of the substrate 1, so that when the cutting area B2 is cut subsequently, cracks may be prevented from being generated in the cutting area B2, and may be prevented from propagating to other areas (e.g., the display region A).

In some embodiments, with reference to FIG. 4d, the display area A of the display substrate includes a plurality of pixel circuit areas A1 (only one pixel circuit area A1 is shown in FIG. 4c). In the process of forming the first vias 14 each penetrating the at least a portion of the first functional layer 3 and the at least a portion of the second functional layer 5, i.e., in S300, the manufacturing method of the display substrate further includes S310*c*.

In S310*c*, fifth grooves 34 each penetrating at least a portion of the second functional layer 5 and at least a portion of the first functional layer 3 are formed, and the fifth grooves 34 each are located between two adjacent pixel circuit areas A1.

With reference to FIGS. 4d and 4e, in the process of forming the interlayer dielectric layer 15 on the second functional layer 5, i.e., in S400, a portion of the interlayer dielectric layer 15 is filled in the fifth grooves 34.

For example, the pixel circuit area A1 represents an area provided with a pixel driving circuit in the display substrate. For example, with reference to FIGS. 4c and 4i, the pixel circuit area A1 represents an area provided with first active layer(s) 2, second active layer(s) 4, first conductive patterns 26 and second conductive patterns 27.

It will be understood that a plurality of pixel driving circuits are provided in the display substrate, and a pixel driving circuit is disposed in a pixel circuit area A1.

It will be noted that, referring to FIG. 4c, the fifth groove 34 penetrates the at least a portion of the second functional layer 5 and the at least a portion of the first functional layer 3, i.e., the fifth gate insulating layer 13, the third gate insulating layer 10, the second gate insulating layer 8 and the first gate insulating layer 6.

For example, referring to FIG. 4c, a method of forming the fifth grooves 34 each penetrating the at least a portion of the second functional layer 5 and the at least a portion of the first functional layer 3 includes a photolithography process.

By forming the fifth groove 34 between two adjacent pixel circuit areas A1, a portion of the first functional layer 3 and the second functional layer 5 located between the adjacent two pixel circuit areas A1 may be removed.

It will be understood that the more inorganic layers in the display substrate, the greater rigidity of the display substrate and the less resistant to deformation. Therefore, by removing the portion of the inorganic film layers between two adjacent pixel circuit areas, a rigidity of a portion of the display substrate located between the two adjacent pixel circuit areas may be reduced, thereby increasing the deformation resistance of the display substrate.

Furthermore, the interlayer dielectric layer 15 includes an organic material, and thus has good flexibility. A portion of the interlayer dielectric layer 15 is filled in the fifth grooves 34, so that flexibility between two adjacent pixel circuit areas A1 may be increased, thereby further increasing the deformation resistance of the display substrate.

In some embodiments, a step of forming the fifth grooves 34 each penetrating the at least a portion of the second functional layer 5 and the at least a portion of the first functional layer 3 includes as follows. Referring to FIG. 4c, before forming the first vias 14 each penetrating the at least a portion of the first functional layer 3 and the at least a portion of the second functional layer 5 in S300, sixth grooves 35 each penetrating at least a portion of the second functional layer 5 and the third gate insulating layer 10 are formed, and the sixth grooves 35 each are located between two adjacent pixel circuit areas. Then, in the process of forming the first vias 14 each penetrating the at least a portion of the second functional layer 5 and the at least a portion of the first functional layer 3 in S300, referring to FIG. 4d, seventh grooves 36 that penetrate the second gate insulating layer 8 and the first gate insulating layer 6 and are respectively communicated with the sixth grooves 35 are formed through the sixth grooves 35. A fifth groove 34 includes a sixth groove 35 and a seventh groove 36.

For example, referring to FIG. 4c, a method of forming the sixth grooves 35 each penetrating the at least a portion of the second functional layer 5 and the third gate insulating layer 10 includes a photolithography process.

For example, by forming the sixth grooves 35, a thickness of a portion of the display substrate located in the sixth groove 35 may be reduced, which is conducive to forming the seventh groove 36 through the sixth groove 35.

For example, referring to FIG. 4c, a method of forming the seventh grooves 36 each penetrating the second gate insulating layer 8 and the first gate insulating layer 6 and each communicated with the sixth groove 35 includes a photolithography process.

Furthermore, the first vias 14 and the seventh grooves 36 may be formed in the same process, which may simplify the manufacturing process of the display substrate.

It will be understood that, after the first planarization layer 33 is formed, the manufacturing method of the display substrate further includes S1300 and S1400.

Figure 4N:
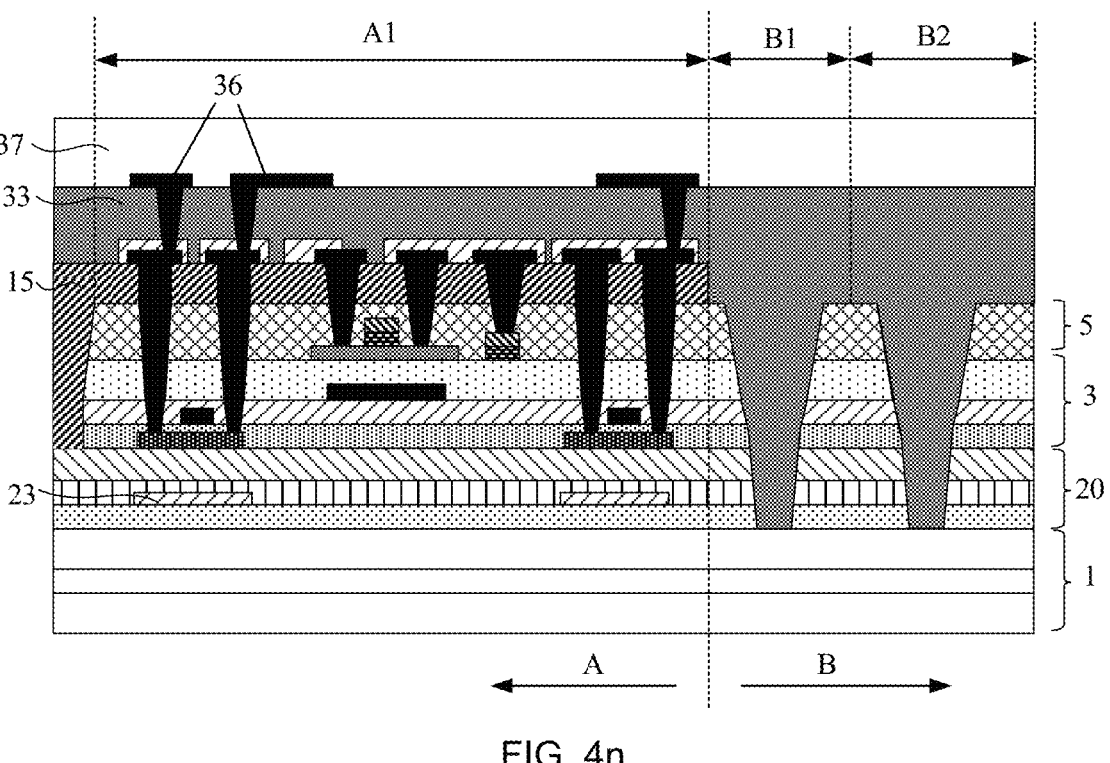

In S1300, referring to FIG. 4n, vias are formed in the first planarization layer 33, and third conductive patterns 36 are formed in the respective vias. A second planarization layer 37 is formed on the third conductive patterns 36.

Figure 4O:
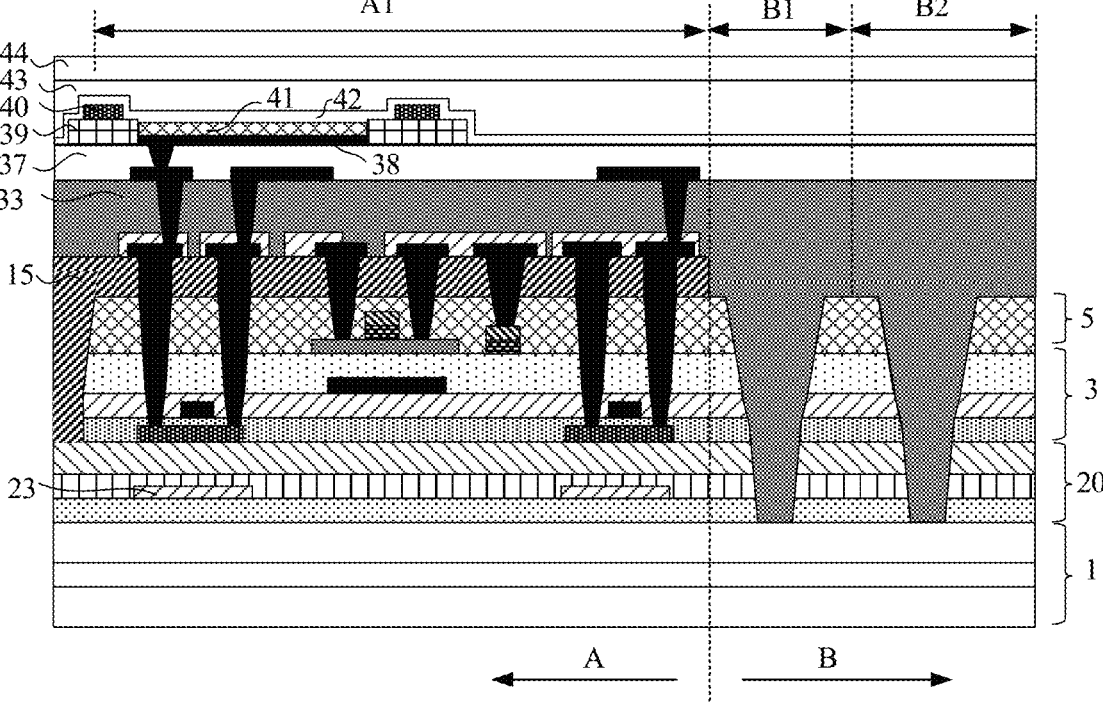

In S1400, referring to FIG. 4o, anodes 38, a pixel defining layer 39, barriers 40, light-emitting layers 41, cathodes 42, an encapsulation layer 43 and a cover plate 44 are formed in sequence on the second planarization layer 37.

For example, the third conductive pattern 36 is used for transferring a signal of the first conductive pattern 26. The second planarization layer 37 is used for providing a planar surface for subsequent film layers. The anode 38 is used for receiving and transmitting the signal of the third conductive pattern 36 to the light-emitting layer 41. The pixel defining layer 39 is used for forming openings. The barrier 40 is used for supporting the display substrate to be formed in a process of forming the light-emitting layers 41 by using an evaporation process. The anode 38, the light-emitting layer 41 and the cathode 42 constitute a light-emitting device, and light-emitting devices are used for displaying images in the display area A of the display substrate. The encapsulation layer 43 is used for protecting the light-emitting devices. The cover plate 44 is used for protecting the formed display substrate.

Areas formed in partial steps of the manufacturing method of the display substrate will be described below with reference to FIGS. 8a to 8d.

As described above, with reference to FIGS. 4d and 8a, in the manufacturing method of the display substrate, before forming the first vias 14 each penetrating the at least a portion of the second functional layer 5 and the at least a portion of the first functional layer 3 in S300, the sixth grooves 35 each penetrating the at least a portion of the second functional layer 5 and the third gate insulating layer 10 are formed, and the sixth grooves 35 each are located between two adjacent pixel circuit areas A1.

It will be noted that the A area in FIG. 8a is an area where the sixth grooves 35 are located. That is, before forming the first vias 14 each penetrating the at least a portion of the second functional layer 5 and the at least a portion of the first functional layer 3 in S300, a portion of the second functional layer 5 and a portion of the third gate insulating layer 10 in this area are removed.

Figure 8B:
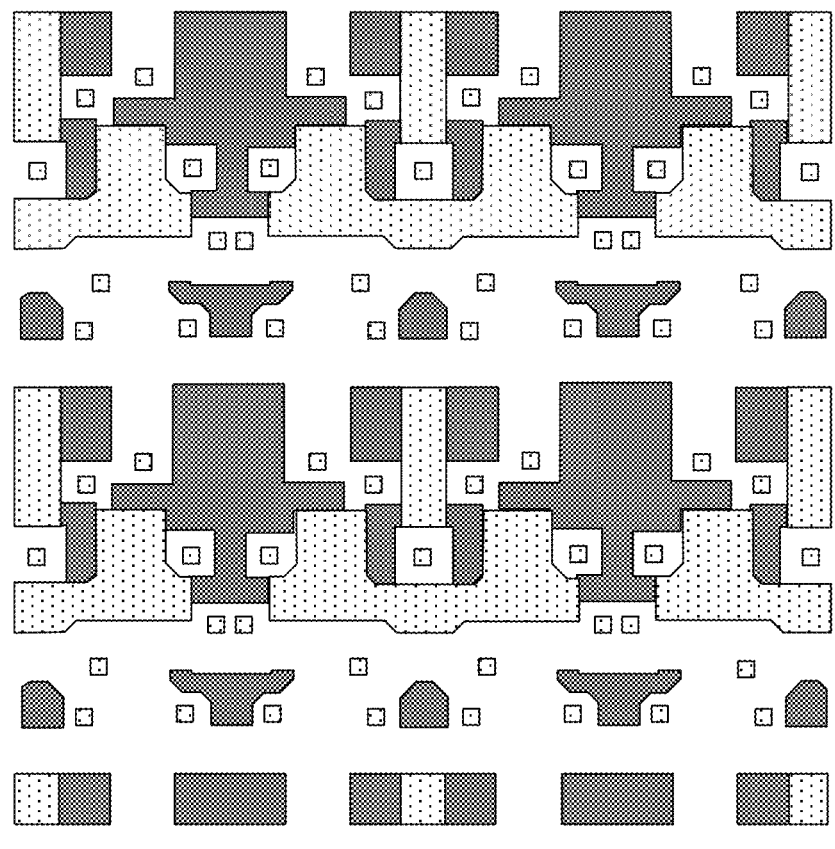

With reference to FIGS. 4c and 8b, after forming the first vias 14 in S300, forming the first groove(s) 24 in S310a, forming the third groove(s) 31 in S310b, and forming the fifth grooves 34 in S310c, FIG. 8a is changed into FIG. 8b.

It will be noted that the B area in FIG. 8b is an area where the first vias 14, the first groove(s) 24, and the third groove(s) 31 are located. Referring to FIG. 4d, it will be understood that an area where the fifth grooves 34 formed in S310c are located coincides with the A area.

Figure 8C:
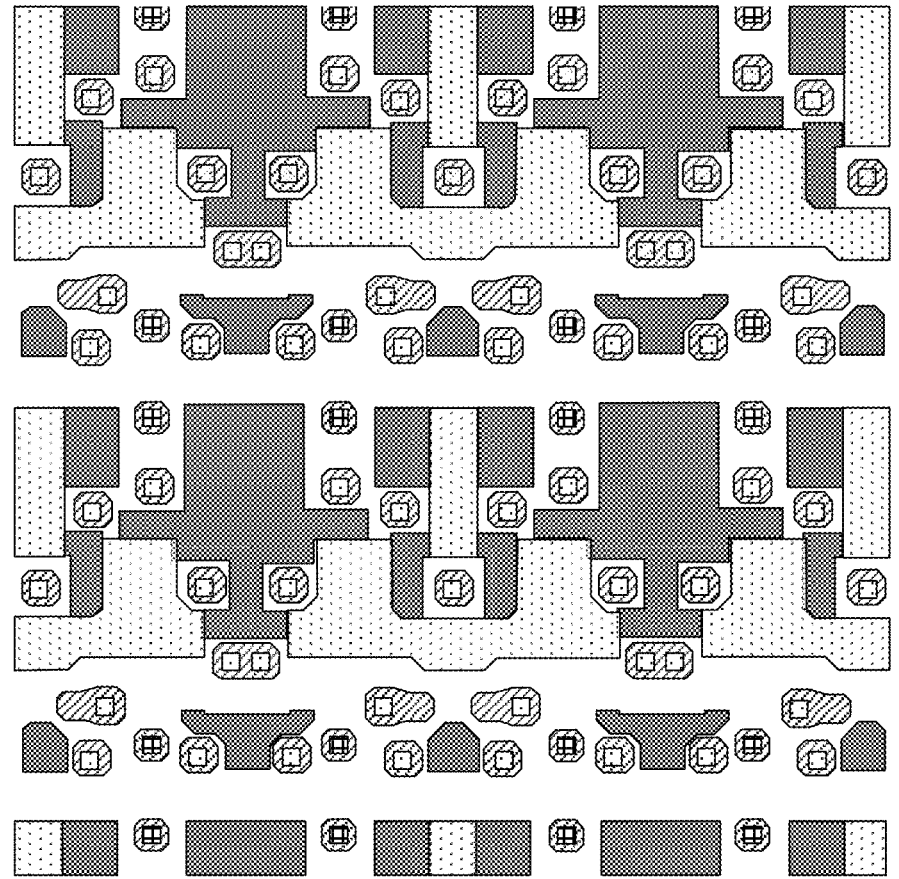

With reference to FIGS. 4e and 8c, after forming the interlayer dielectric layer 15 in S400, removing the portions of the interlayer dielectric layer 15 that are respectively filled in the first vias 14, the first groove(s) 24, and the third groove(s) 31 in S500, and forming the fourth vias 18 each penetrating the interlayer dielectric layer 15 in S510, FIG. 8b is changed into FIG. 8c.

It will be noted that, with reference to FIGS. 4d to 4f-2, the C area in FIG. 8c is an area where a remaining portion of the interlayer dielectric layer 15 is located after the portions of the interlayer dielectric layer 15 that are respectively filled in the first vias 14, the first groove(s) 24 and the third groove(s) 31 are removed. Referring to FIGS. 4f-1 and 4f-2, it will be understood that an area where another remaining portion of the interlayer dielectric layer 15 is located coincides with the A area in FIG. 8c. Referring to FIG. 4f-2, the D area in FIG. 8c is an area where the fourth vias 18 each penetrating the interlayer dielectric layer 15 in S510 are located.

With reference to FIGS. 4f-1, 4f-2, 4g and 8c, after forming the third vias 17 each penetrating the interlayer dielectric layer 15 and the at least a portion of the second functional layer 5 in S600, an area where the third vias 17 are located coincides with the area where the fourth vias 18 are located. Thus, after S600, FIG. 8c is not changed.

Figure 8D:
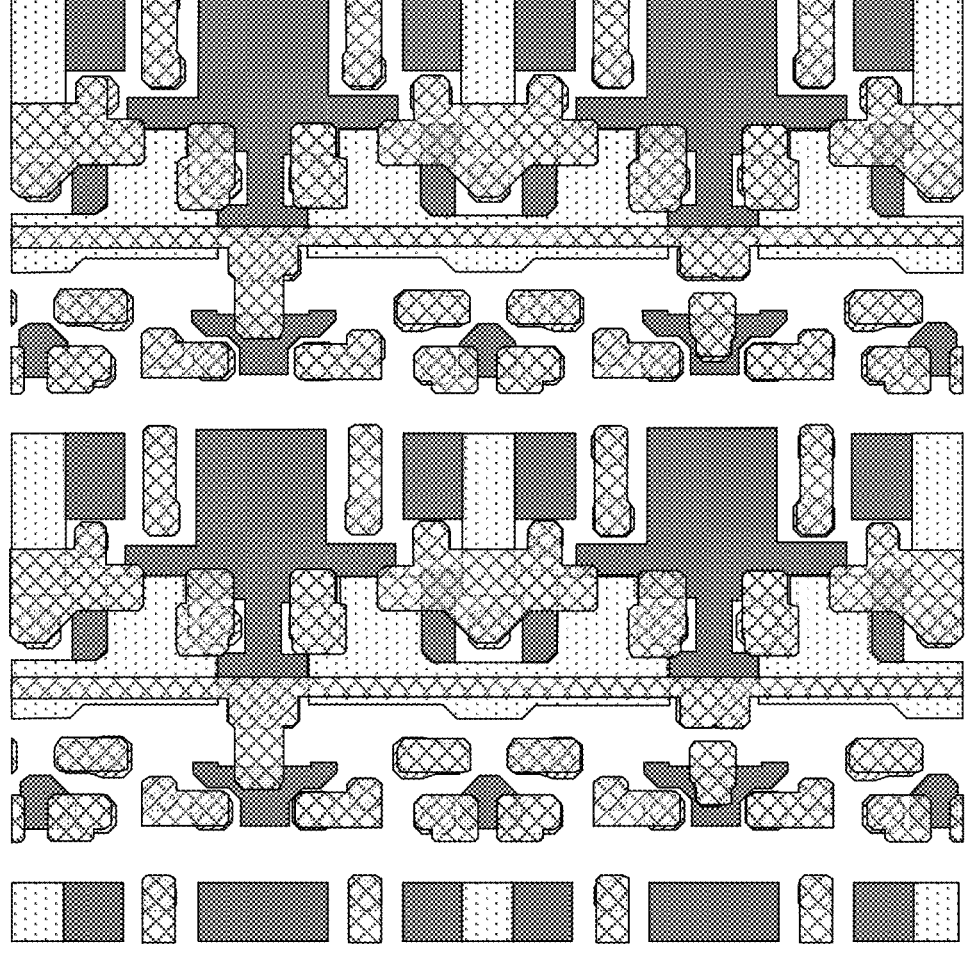

With reference to FIGS. 4h, 4i and 8d, after forming the first conductive film 25 on the interlayer dielectric layer 15 and patterning the first conductive film 25 to obtain the first conductive patterns 26 and the second conductive patterns 27 in S700, FIG. 8c is changed into FIG. 8d.

It will be noted that with reference to FIG. 4*i*, an area where the first conductive patterns 26 and the second conductive patterns 27 are located is the E area in FIG. 8*d*.

In another aspect, some embodiments of the present disclosure provide the display substrate 100. The display substrate 100 is, for example, manufactured by using the manufacturing method of the display substrate provided in some of the above embodiments.

Figures 9, 10:
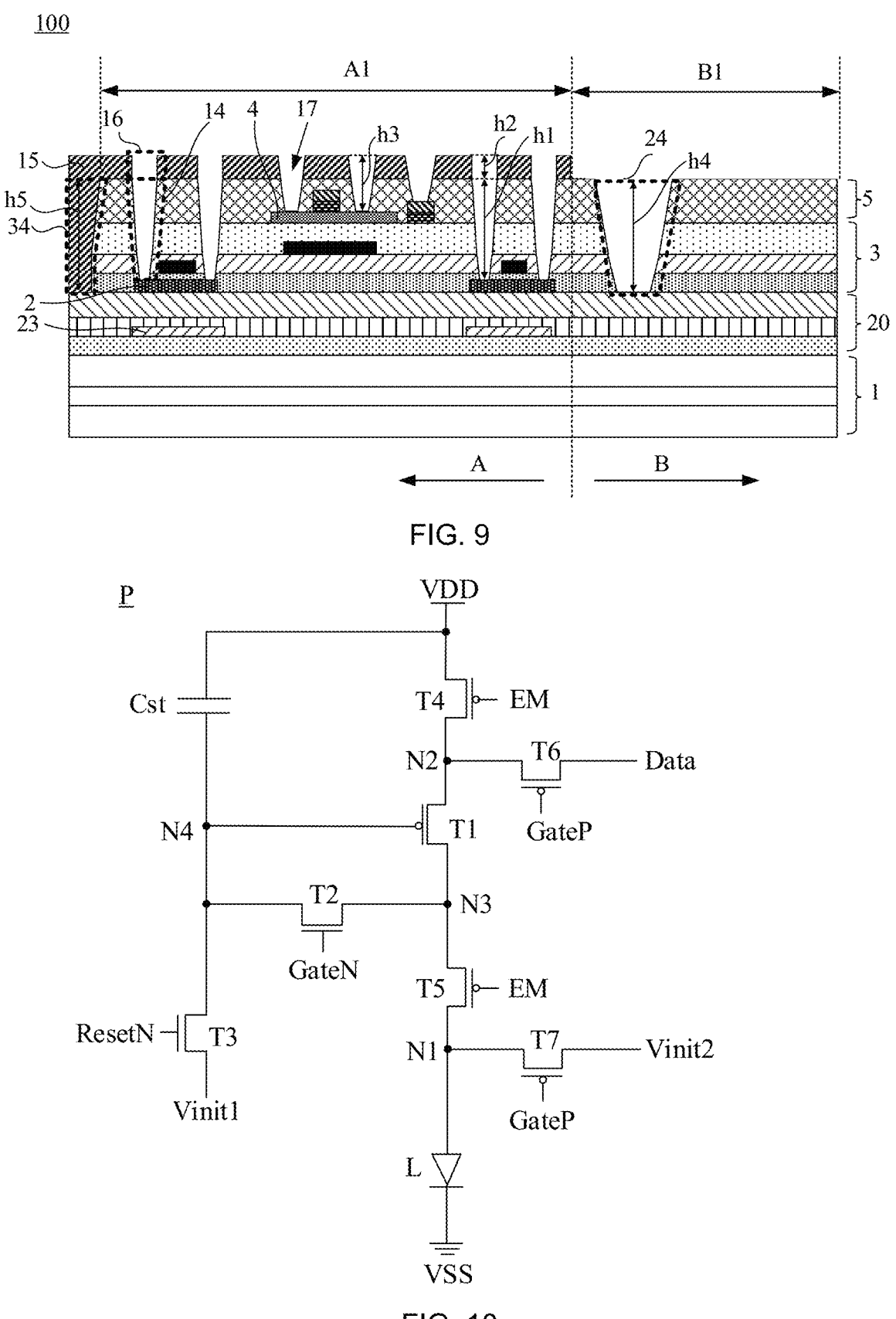
FIG. 9 is a structural diagram of a display substrate, in accordance with some embodiments of the present disclosure.
FIG. 10 is a circuit diagram of a pixel circuit, in accordance with some embodiments of the present disclosure.

Referring to FIG. 9, the display substrate 100 includes the substrate 1, and the first active layers 2, the first functional layer 3, the second active layer(s) 4, the second functional layer 5 and the interlayer dielectric layer 15 stacked in sequence on the substrate 1. The display substrate 100 further includes the first vias 14, the second vias 16 and the third vias 17. The first via 14 penetrates the at least a portion of the second functional layer 5 and the at least a portion of the first functional layer 3, and exposes the partial surface of the first active layer 2. The second via 16 penetrates the interlayer dielectric layer 15, and is communicated with the first via 14. The third via 17 exposes the partial surface of the second active layer 4. The first vias 14 are formed before the interlayer dielectric layer, and the third vias 17 are formed later than the interlayer dielectric layer. The aperture diameter of the first via 14 is less than the aperture diameter of the second via 16, and the aperture diameter of the first via 14 is less than the aperture diameter of the third via 17.

For example, the aperture diameter of the first via 14 is less than the aperture diameter of the second via 16, so that in the process of removing the interlayer dielectric layer 15 formed in the first via 14 through the second via 16, an interference to the process of removing the interlayer dielectric layer 15 formed in the first via 14 due to an excessively small second via 16 may be avoided.

In the above implementation, as described above, the first connection holes 6' and the second connection holes 7' are formed synchronously, and thus an aperture diameter of the first connection hole 6' and an aperture diameter of the second connection hole 7' are substantially the same.

The first vias 14 are formed before the interlayer dielectric layer 15 and the third vias 17 are formed later than the interlayer dielectric layer 15, which means that the first vias 14 and the third vias 17 are not formed synchronously. However, after the first vias 14 are formed, the interlayer dielectric layer 15 with the second vias 16 is formed firstly, and then the third vias 17 are formed.

It will be noted that, for example, the process of forming the first vias 14 is the same as that of the first connection holes 6' in the above implementation. Therefore, the aperture diameter of the first via 14 is the same as that of the first connection hole 6' in the above implementation.

Therefore, the aperture diameter of the third via 17 is greater than that of the second connection hole 7' in the above implementation manner, so that an area of the second active layer 4 exposed by the third via 17 is increased. That is, a contact area between the finally formed source and the second active layer 4 is increased, and a contact area between the finally formed drain and the second active layer 4 is increased, so that the contact resistance between the source and the second active layer 4 is reduced, and the contact resistance between the drain and the second active layer 4 is reduced.

Moreover, the step of cleaning the display substrate with the cleaning agent is performed before the third vias 17 are formed, so that the cleaning agent may be prevented from corroding the second active layer 4 exposed through the subsequently formed third via 17.

Beneficial effects that can be achieved by the display substrate 100 provided in some embodiments of the present disclosure are the same as the beneficial effects that can be achieved by the manufacturing method of the display substrate provided in some of the above embodiments, and will not be repeated here.

In some embodiments, referring to FIG. 9, the display substrate 100 has the display area A and the non-display area B. The display area A includes the pixel circuit areas A1, and the display substrate 100 further includes the fifth grooves 34 and the first groove(s) 24. The fifth groove 34 penetrates the at least a portion of the second functional layer 5 and the at least a portion of the first functional layer 3, and is located between two adjacent pixel circuit areas A1. The first groove 24 penetrates the at least a portion of the second functional layer 5 and the at least a portion of the first functional layer 3. A depth h2 of the second via 16 is less than or equal to a depth h3 of the third via 17. The depth h3 of the third via 17 is less than a depth h1 of the first via 14. The depth h1 of the first via 14 is less than a depth h5 of the fifth groove 34. The depth h5 of the fifth groove 34 is equal to a depth h4 of the first groove 24.

For example, at least one pixel circuit area A1 is provided with a pixel driving circuit P (as shown in FIG. 10) therein.

A structure of the pixel driving circuit P may vary, and may be set according to actual needs. For example, the pixel driving circuit P may have a structure of "2T1C," "6T1C," "7T1C," "6T2C" or "7T2C". Here, "T" represents a thin film transistor, a number before "T" represents the number of thin film transistors, "C" represents a storage capacitor, and a number before "C" represents the number of storage capacitors.

Referring to FIG. 10, the pixel driving circuit P with the 7T1C structure will be exemplarily described below.

It will be noted that the pixel driving circuit P may include a plurality of transistors. The plurality of transistors may include a driving transistor T1, a compensation transistor T2, a first reset transistor T3, a first light-emitting control transistor T4, a second light-emitting control transistor T5, a switching transistor T6, and a second reset transistor T7.

In some examples, a control electrode of the first reset transistor T3 is electrically connected to the reset signal line ResetN, a first electrode of the first reset transistor T3 is electrically connected to the first initialization signal line Vinit1, and a second electrode of the first reset transistor T3 is electrically connected to a fourth node N4. The first reset transistor T3 is configured to transmit a first initialization signal provided from the first initialization signal line Vinit1 to the fourth node N4 under a control of a reset signal provided from the reset signal line ResetN.

In some examples, a control electrode of the second reset transistor T7 is electrically connected to the first gate line GateP, a first electrode of the second reset transistor T7 is electrically connected to the second initialization signal line Vinit2, and a second electrode of the second reset transistor T7 is electrically connected to a first node N1. The second reset transistor T7 is configured to transmit a second initialization signal provided from the second initialization signal line Vinit2 to the first node N1 under a control of a first gate signal provided from the first gate line GateP.

In some examples, a control electrode of the switching transistor T6 is electrically connected to the first gate line GateP, a first electrode of the switching transistor T6 is electrically connected to a data signal line Data, and a second electrode of the switching transistor T6 is electrically connected to a second node N2. The switching transistor T6 is configured to transmit a data signal provided from the data signal line Data to the second node N2 under the control of the first gate signal provided from the first gate line GateP.

In some examples, a control electrode of the driving transistor T1 is electrically connected to the fourth node N4, a first electrode of the driving transistor T1 is electrically connected to the second node N2, and a second electrode of the driving transistor T1 is electrically connected to a third node N3. The driving transistor T1 is configured to transmit an electrical signal (e.g., data signal) from the second node N2 to the third node N3 under a control of a voltage of the fourth node N4.

In some examples, a control electrode of the compensation transistor T2 is electrically connected to the second gate line GateN, a first electrode of the compensation transistor T2 is electrically connected to the third node N3, and a second electrode of the compensation transistor T2 is electrically connected to the fourth node N4. The compensation transistor T2 is configured to transmit an electrical signal (e.g., data signal) from the third node N3 to the fourth node N4 under a control of a second gate signal provided from the second gate line GateN.

In some examples, a control electrode of the first light-emitting control transistor T4 is electrically connected to the enable signal line EM, a first electrode of the first light-emitting control transistor T4 is electrically connected to a first power line VDD, and a second electrode of the first light-emitting control transistor T4 is electrically connected to the second node N2. The first light-emitting control transistor T4 is configured to transmit a first power signal provided from the first power line VDD to the second node N2 under a control of an enable signal provided from the enable signal line EM. The driving transistor T1 may transmit the electrical signal (e.g., first power signal) from the second node to the third node N3.

In some examples, a control electrode of the second light-emitting control transistor T5 is electrically connected to the enable signal line EM, a first electrode of the second light-emitting control transistor T5 is electrically connected to the third node N3, and a second electrode of the second light-emitting control transistor T5 is electrically connected to the first node N1. The second light-emitting control transistor T5 is configured to transmit an electrical signal (e.g., first power signal) from the third node N3 to the first node N1 under the control of the enable signal provided from the enable signal line EM.

It will be understood that a control electrode of each transistor is a gate (e.g., the first gate 7, the second gate 9 or the third gate 12 described in some of the above embodiments), a first electrode of each transistor is one of a source and a drain (e.g., the first conductive pattern 26 or the second conductive pattern 27 described in some of the above embodiments), and a second electrode of each transistor is another one of the source and the drain (e.g., the first conductive pattern 26 or the second conductive pattern 27 described in some of the above embodiments).

Figure 11:
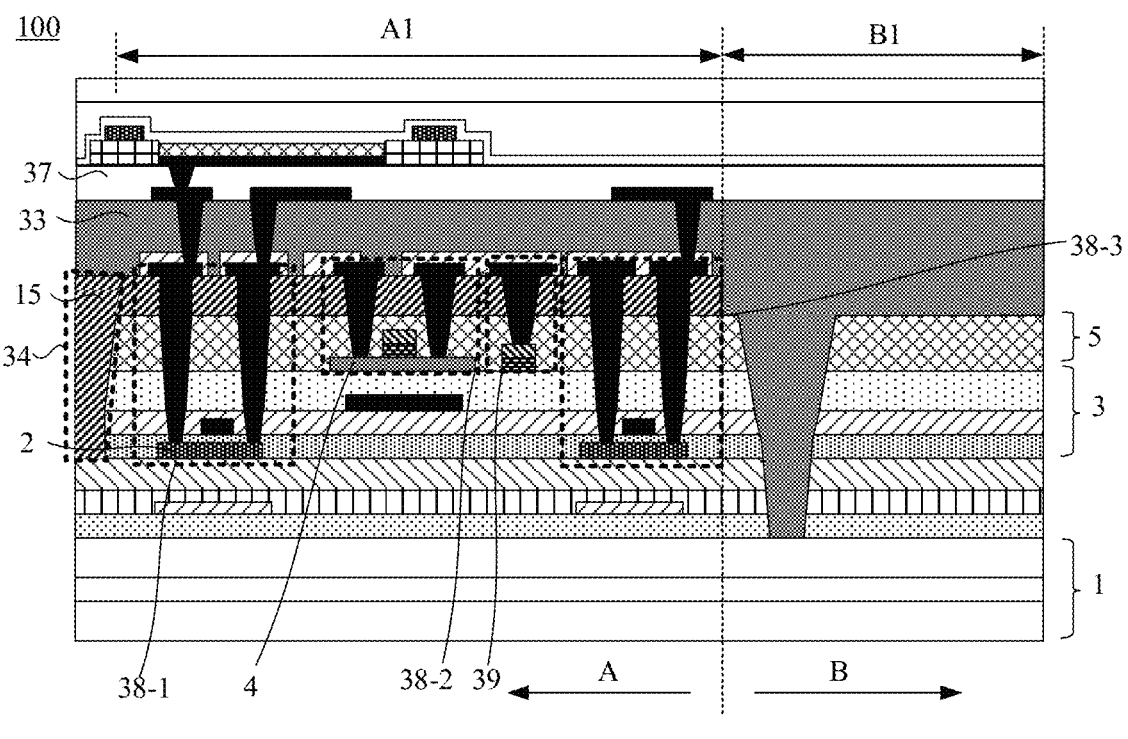
FIG. 11 is a structural diagram of another display substrate, in accordance with some embodiments of the present disclosure.

For example, referring to FIG. 11, three transistors 38-1, 38-2, and 38-3 are illustrated.

For example, active layers of the transistors 38-1 and 38-3 include polysilicon, so that the transistors 38-1 and 38-3 have a high mobility, which may accelerate a charging speed of the storage capacitor in the pixel driving circuit P.

The transistor 38-1 may be the second light-emitting controlling transistor T5 or the second reset transistor T7. The transistor 38-3 may be the driving transistor T1 or the first light-emitting control transistor T4.

For example, an active layer of the transistor 38-2 includes metal oxide, and thus the transistor 38-2 has a lower leakage current.

The transistor 38-2 may be the compensation transistor T2 or the first reset transistor T3.

For example, with reference to FIGS. 10 and 11, an initialization signal line 39 (which may be, for example, the first initialization signal line Vinit1 or the second initialization signal line Vinit2 described in the above examples) is illustrated. Referring to FIG. 10, the initialization signal line 39 is used for providing an initialization signal. In a case where the first reset transistor T3 is turned on and/or the second reset transistor T7 is turned on, the initialization signal provided from the initialization signal line 39 may reset a corresponding capacitor Cst and/or a corresponding light-emitting device L.

For example, the interlayer dielectric layer 15 includes the organic material, and thus has good flexibility. The portion of the interlayer dielectric layer 15 may be filled in the fifth grooves 34, so that flexibility between two adjacent pixel circuit areas A1 may be increased, thereby increasing the deformation resistance of the display substrate 100.

It will be noted that a depth described above indicates a distance between upper and lower surfaces of a via or a groove in a direction perpendicular to the plane where the display substrate 100 is located.

The depth of the fifth groove 34 is set to be equal to the depth of the first groove 24, so that in the process of forming the fifth grooves 34 and in the process of forming the first groove(s) 24, the thickness of the removed film layers may be the same. Therefore, process parameters for forming the fifth grooves 34 are the same as process parameters for forming the first groove(s) 24, and the manufacturing process of the display substrate is simplified.

Figure 12:
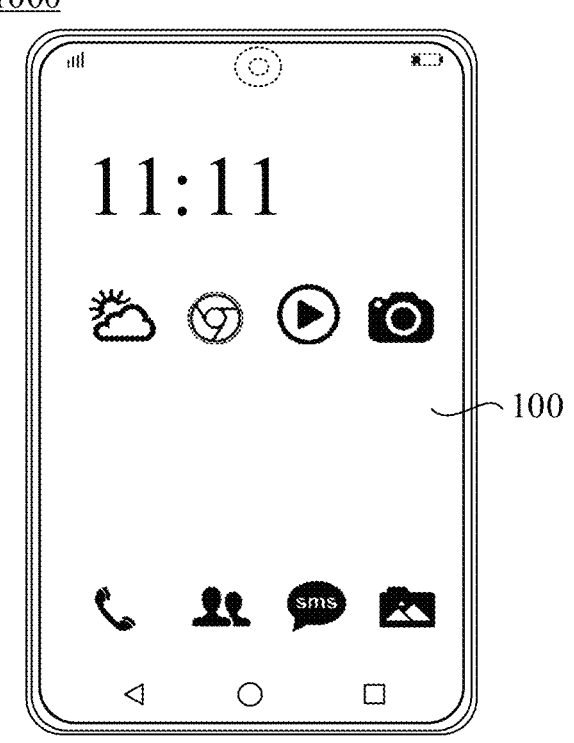
FIG. 12 is a structural diagram of a display device, in accordance with some embodiments of the present disclosure.

In another aspect, referring to FIG. 12, some embodiments of the present disclosure provide a display device 1000. The display device 1000 includes the display substrate 100 in some of the above examples.

For example, the display device 1000 further includes a housing for protecting the display substrate 100.

The display substrate 100 included in the display device 1000 has the same structure and beneficial effects as the display substrate 100 provided in some of the above examples, which will not be repeated here.

In some examples, the display device 1000 may be any device that displays text or images whether moving (e.g., videos) or stationary (e.g., still images). More specifically, it is anticipated that the embodiments may be implemented in, or associated with, a variety of electronic devices. The variety of electronic devices are, for example (but not limit to), mobile phones, wireless devices, personal digital assistants (PDAs), hand-held or portable computers, global positioning system (GPS) receivers/navigators, cameras, moving picture experts group 4 (MP4) video players, camcorders, game consoles, watches, clocks, calculators, television monitors, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packaging and aesthetic structures (e.g., displays for displaying an image of a piece of jewelry).

The foregoing descriptions are merely specific implementation manners of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. A display substrate having a display area and a non-display area, the display area including pixel circuit areas; the display substrate comprising:

a substrate;

first active layers, a first functional layer, a second active layer, a second functional layer and an interlayer dielectric layer stacked in sequence on the substrate;

first vias each penetrating at least a portion of the second functional layer and at least a portion of the first functional layer, the first vias each exposing a partial surface of a first active layer;

second vias each penetrating the interlayer dielectric layer, the second vias being respectively communicated with the first vias;

third vias each penetrating the interlayer dielectric layer and at least another portion of the second functional layer, the third vias each exposing a partial surface of the second active layer;

fifth grooves each penetrating at least yet another portion of the second functional layer and at least another portion of the first functional layer and each located between two adjacent pixel circuit areas; and a first groove penetrating at least yet another portion of the second functional layer and at least yet another portion of the first functional layer;

wherein an aperture diameter of a first via is less than an aperture diameter of a second via, and is less than an aperture diameter of a third via; and a depth of a second via in the second vias is less than or equal to a depth of a third via in the third vias; the depth of the third via is less than a depth of a first via in the first vias; the depth of the first via is less than a depth of a fifth groove; the depth of the fifth groove is equal to a depth of the first groove.

2. A manufacturing method of a display substrate, comprising:

providing a substrate;

forming first active layers, a first functional layer, a second active layer and a second functional layer in sequence on the substrate;

forming first vias each penetrating at least a portion of the second functional layer and at least a portion of the first functional layer, the first vias each exposing a partial surface of a first active layer;

forming an interlayer dielectric layer on the second functional layer, a portion of the interlayer dielectric layer being filled in the first vias;

removing the portion of the interlayer dielectric layer that is filled in the first vias;

forming second vias that are respectively communicated with the first vias in the interlayer dielectric layer; and forming third vias each penetrating the interlayer dielectric layer and at least another portion of the second functional layer, the third vias each exposing a partial surface of the second active layer.

3. The manufacturing method according to claim 2, wherein in a process of removing the portion of the interlayer dielectric layer that is filled in the first vias and forming the second vias that are respectively communicated with the first vias in the interlayer dielectric layer, the manufacturing method further comprises:

forming fourth vias each penetrating the interlayer dielectric layer; wherein an orthographic projection of a fourth via on the substrate is located within an orthographic projection of the second active layer on the substrate; wherein forming the third vias each penetrating the interlayer dielectric layer and the at least another portion of the second functional layer, includes:

patterning the second functional layer through the fourth vias to form fifth vias each penetrating the at least another portion of the second functional layer, a third via including a fourth via and a fifth via.

4. The manufacturing method according to claim 2, wherein the substrate has a display area and a non-display area, and the non-display area includes a bending area; the first active layers and the second active layer are located in the display area;

before forming the first active layers, the first functional layer, the second active layer and the second functional layer in sequence on the substrate, the manufacturing method further comprises:

forming an inorganic layer on the substrate; and in a process of forming the first vias each penetrating the at least a portion of the second functional layer and the at least a portion of the first functional layer, the manufacturing method further comprises:

forming a first groove penetrating at least yet another portion of the second functional layer and at least another portion of the first functional layer; the first groove being located in the bending area, and exposing a partial surface of the inorganic layer.

5. The manufacturing method according to claim 4, wherein the manufacturing method further comprises:

forming a first conductive film on the interlayer dielectric layer, wherein the first conductive film covers a surface of the interlayer dielectric layer and is located in the first vias, the second vias, the third vias and the first groove; and patterning the first conductive film, so that a portion of the first conductive film located in the first vias and the second vias is retained to obtain first conductive patterns, and a portion of the first conductive film located in the third vias is retained to obtain second conductive patterns.

6. The manufacturing method according to claim 5, wherein a contact resistance between a first conductive pattern and a first active layer whose partial surface is exposed through a first via where the first conductive pattern is located is in a range of 969$\Omega$ to 1747$\Omega$, inclusive.

7. The manufacturing method according to claim 5, wherein the manufacturing method further comprises:

forming a passivation layer on the first conductive patterns and the second conductive patterns, wherein a portion of the passivation layer is located in the first groove, and is in contact with the exposed partial surface of the inorganic layer; and patterning the passivation layer to remove at least the portion of the passivation layer located in the first groove.

8. The manufacturing method according to claim 5, further comprising:

patterning the inorganic layer through the first groove to form a second groove that is communicated with the first groove, the second groove exposing a partial surface of the substrate; and forming a first planarization layer, a portion of the first planarization layer being filled in the first groove and the second groove, and being in contact with the exposed partial surface of the substrate.

9. The manufacturing method according to claim 4, wherein the non-display area further includes a cutting area located on a side of the bending area away from the display area;

in a process of forming the first groove penetrating the at least yet another portion of the second functional layer and the at least another portion of the first functional layer, the manufacturing method further comprises:

forming a third groove penetrating at least yet another portion of the second functional layer and at least yet another portion of the first functional layer, wherein the third groove is located in the cutting area, and exposes another partial surface of the inorganic layer.

10. The manufacturing method according to claim 9, wherein the manufacturing method further comprises:

patterning the inorganic layer through the third groove to form a fourth groove that is communicated with the third groove, wherein the fourth groove exposes a partial surface of the substrate; and forming a first planarization layer, a portion of the first planarization layer being filled in the third groove and the fourth groove, and being in contact with the exposed partial surface of the substrate.

11. The manufacturing method according to claim 2, forming the first functional layer includes:

forming a first gate insulating layer, first gates, a second gate insulating layer, a second gate and a third gate insulating layer in sequence, wherein an orthographic projection of a first gate on the substrate is partially overlapped with an orthographic projection of a first active layer in the first active layers on the substrate, and an orthographic projection of the second gate on the substrate is partially overlapped with an orthographic projection of the second active layer on the substrate; and forming the second functional layer includes:

forming a fourth gate insulating layer, a third gate and a fifth gate insulating layer in sequence, wherein an orthographic projection of the third gate on the substrate is partially overlapped with the orthographic projection of the second active layer on the substrate.

12. The manufacturing method according to claim 11, wherein the substrate has a display area including a plurality of pixel circuit areas;

in a process of forming the first vias each penetrating the at least a portion of the second functional layer and the at least a portion of the first functional layer, the manufacturing method further comprises:

forming fifth grooves each penetrating at least yet another portion of the second functional layer and at least another portion of the first functional layer, the fifth grooves each being located between two adjacent pixel circuit areas; and in a process of forming the interlayer dielectric layer on the second functional layer, another portion of the interlayer dielectric layer is filled in the fifth grooves.

13. The manufacturing method according to claim 12, wherein forming the fifth grooves each penetrating the at least yet another portion of the second functional layer and the at least another portion of the first functional layer, includes:

before forming the first vias each penetrating the at least a portion of the second functional layer and the at least a portion of the first functional layer, forming sixth grooves each penetrating at least yet another portion of the second functional layer and the third gate insulating layer, the sixth grooves each being located between two adjacent pixel circuit areas; and in the process of forming the first vias each penetrating the at least a portion of the second functional layer and the at least a portion of the first functional layer, forming seventh grooves that penetrate the second gate insulating layer and the first gate insulating layer and are respectively communicated with the sixth grooves through the sixth grooves, a fifth groove including a sixth groove and a seventh groove.

14. The manufacturing method according to claim 11, wherein an orthographic projection of the fourth gate insulating layer on the substrate coincides with the orthographic projection of the third gate on the substrate.

15. The manufacturing method according to claim 2, wherein a material of the first active layers includes polysilicon, and a material of the second active layer includes metal oxide.

16. A display device comprising the display substrate according to claim 1.

17. The manufacturing method according to claim 3, wherein the substrate has a display area and a non-display area, and the non-display area includes a bending area; the first active layers and the second active layer are located in the display area;

before forming the first active layers, the first functional layer, the second active layer and the second functional layer in sequence on the substrate, the manufacturing method further comprises:

forming an inorganic layer on the substrate; and in a process of forming the first vias each penetrating the at least a portion of the second functional layer and the at least a portion of the first functional layer, the manufacturing method further comprises:

forming a first groove penetrating at least yet another portion of the second functional layer and at least another portion of the first functional layer; the first groove being located in the bending area, and exposing a partial surface of the inorganic layer.

18. The manufacturing method according to claim 17, wherein the non-display area further includes a cutting area located on a side of the bending area away from the display area;

in a process of forming the first groove penetrating the at least yet another portion of the second functional layer and the at least another portion of the first functional layer, the manufacturing method further comprises:

forming a third groove penetrating at least yet another portion of the second functional layer and at least yet another portion of the first functional layer, wherein the third groove is located in the cutting area, and exposes another partial surface of the inorganic layer.

19. The manufacturing method according to claim 3, forming the first functional layer includes:

forming a first gate insulating layer, first gates, a second gate insulating layer, a second gate and a third gate insulating layer in sequence, wherein an orthographic projection of a first gate on the substrate is partially overlapped with an orthographic projection of a first active layer in the first active layers on the substrate, and an orthographic projection of the second gate on the substrate is partially overlapped with an orthographic projection of the second active layer on the substrate; and forming the second functional layer includes:

forming a fourth gate insulating layer, a third gate and a fifth gate insulating layer in sequence, wherein an orthographic projection of the third gate on the substrate is partially overlapped with the orthographic projection of the second active layer on the substrate.

* * * * *